United States Patent
Ito et al.

(10) Patent No.: US 6,625,032 B1
(45) Date of Patent: Sep. 23, 2003

(54) AQUEOUS DISPERSION FORMING CONDUCTIVE LAYER, CONDUCTIVE LAYER, ELECTRONIC COMPENT, CIRCUIT BOARD AND METHOD FOR MANUFACTURING THE SAME, AND MULTILAYER WIRING BOARD AND METHOD FOR MANUFACTURING THE SAME

(75) Inventors: Nobuyuki Ito, Tokyo (JP); Kenichi Koyama, Tokyo (JP)

(73) Assignees: JSR Corporation, Tokyo (JP); JSR Microtech Inc., Hidaka (JP)

( * ) Notice: Subject to any disclaimer, the term of this patent is extended or adjusted under 35 U.S.C. 154(b) by 183 days.

(21) Appl. No.: 09/869,589

(22) PCT Filed: Nov. 1, 2000

(86) PCT No.: PCT/JP00/07683
§ 371 (c)(1),
(2), (4) Date: Aug. 20, 2001

(87) PCT Pub. No.: WO01/32964
PCT Pub. Date: May 10, 2001

(51) Int. Cl.$^7$ ................................................. H05K 1/00
(52) U.S. Cl. ................................................. 361/751
(58) Field of Search ........................... 361/748, 749, 361/750, 751; 205/122, 125, 183; 430/314

(56) References Cited

U.S. PATENT DOCUMENTS

| | | | |
|---|---|---|---|
| 5,055,374 A | * 10/1991 | Seio et al. | 430/190 |
| 5,139,642 A | * 8/1992 | Randolph et al. | 205/125 |
| 5,494,764 A | * 2/1996 | Hyodo | 430/31 |
| 5,576,148 A | * 11/1996 | Imai et al. | 430/314 |
| 5,773,519 A | 6/1998 | Ito et al. | |
| 5,858,198 A | * 1/1999 | Florio et al. | 205/183 |
| 5,967,964 A | 10/1999 | Hattori et al. | |
| 6,146,749 A | 11/2000 | Miyamoto et al. | |
| 6,214,923 B1 | 4/2001 | Goto et al. | |
| 6,515,066 B2 | * 2/2003 | Allen et al. | 524/520 |

FOREIGN PATENT DOCUMENTS

| | | |
|---|---|---|
| JP | 57-010663 | 1/1982 |
| JP | 57-070153 | 4/1982 |
| JP | 58-174421 | 10/1983 |
| JP | 03-208804 | 9/1991 |
| JP | 03-290448 | 12/1991 |
| JP | 09-134891 | 5/1997 |
| JP | 09-208865 | 8/1997 |
| JP | 09-235495 | 9/1997 |
| JP | 11-049951 | 2/1999 |
| JP | 11-060947 | 3/1999 |

* cited by examiner

*Primary Examiner*—Adolf D. Berhane
(74) *Attorney, Agent, or Firm*—Oblon, Spivak, McClelland, Maier & Neustadt, P.C.

(57) ABSTRACT

An aqueous dispersion of the invention has conductive microparticles and organic particles dispersed in an aqueous medium and can form a conductive layer of a volume resistivity of for example $10^{-4}$ Ω·cm or less by electrodeposition. A circuit board of the invention is equipped in an insulating layer and a conducting layer, which includes conducting through parts that pass through the insulating layer, and is favorably manufactured by the invention s method that includes an electrodeposition using an aqueous dispersion of the invention as a electrodeposition solution and using the conductive foil as one of the electrodes after closing the openings at one end of the through holes formed on the insulating layer by means of a conductive foil. A multilayer wiring board of the invention is equipped in a core wiring substrate, having substrate wiring layers that are mutually connected electrically formed on both surfaces of an insulating substrate, an insulating layer that is laminated onto at least one of the surfaces of the core wiring substrate, a wiring layer that is formed on the insulating layer, and interlayer shorting parts that pass through the insulating layer and electrically connect the wiring layer to the above-mentioned substrate wiring layer. These interlayer shorting parts are comprised of conductors formed by electrodeposition using an aqueous dispersion of the invention as an electrodeposition solution. Since the conductive layer or the conductor is formed by electrodeposition, the productivity is good and the connection reliability is high.

16 Claims, 6 Drawing Sheets a b c d e

F I G. 1 4
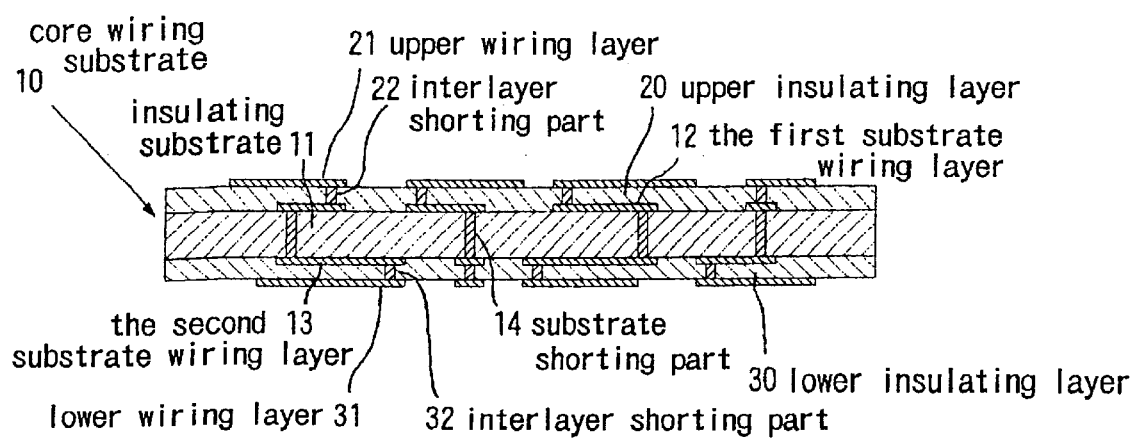

AQUEOUS DISPERSION FORMING CONDUCTIVE LAYER, CONDUCTIVE LAYER, ELECTRONIC COMPENT, CIRCUIT BOARD AND METHOD FOR MANUFACTURING THE SAME, AND MULTILAYER WIRING BOARD AND METHOD FOR MANUFACTURING THE SAME

FIELD OF THE ART

The invention concerns an aqueous dispersion forming conductive layer, a conductive layer formed from the aqueous dispersion, an electronic part equipped with the conductive layer, a circuit board, equipped with a conductive layer formed with the abovementioned aqueous dispersion forming conductive layer, and a method of manufacturing the circuit board, and a multilayer wiring board and a method of manufacturing the multilayer wiring board.

BACKGROUND ART

Since priorly, the metal plating method has been used to form a conductive layer, which is to serve as an electrode, wiring pattern and the like on a substrate. Another method of forming the conductive layer is the method of dispersing a conductive powder in a liquid thermosetting resin material to form a conductive paste and applying the conductive paste onto a substrate by coating, printing, or other method, and thereafter thermosetting the resin. Also, Japanese Unexamined Patent Publication No. Hei-9-134891 discloses a thin film forming method, wherein an ultrafine metal particle dispersive solution, prepared by uniformly dispersing ultrafine particles of a metal in an organic dispersion medium, is coated onto a semiconductor substrate and then the organic solvent is eliminated and the ultrafine metal particles are fused by heat.

Also in recent years, in accompaniment with demands for advanced functions and compact size in electronic equipment, electronic parts of high degrees of integration and large numbers of electrodes are coming to be used and the mounting of such electronic parts at high density is being required. Thus in place of single-sided printed wiring boards, with which a wiring layer is formed on just one surface of an insulating substrate, and double-sided printed wiring boards, with which wiring layers are formed on both surfaces of a substrate, multilayer printed wiring boards, with which insulating layers and wiring layers are layered in an alternating manner on one surface or both surfaces of a substrate, are coming to be used as wiring boards for electronic parts and wiring boards for mounting electronic parts.

Conventionally, the mainstream method of manufacturing a multilayer printed circuit board was the method of laminating a plurality of core wiring substrates, each of which is arranged by forming wiring layers that are electrically connected to each other on both surfaces of an insulating layer, and thermosetting resin prepreg sheets in an alternating manner and performing heat pressing to integrally laminate the plurality of core wiring boards with insulating layers interposed (this method shall be referred to hereinafter as the "lamination press method").

However, with this lamination press method, interlayer shorting parts (buried vias and blind vias), which extend in the thickness direction through just an insulating layer that exists between wiring layers of adjacent core wiring substrates, cannot be formed for electrical connection between the wiring layers, and since interlayer shorting parts (through holes) that extend in the thickness direction through the entire multilayer wiring board must thus be formed, the forming of high-density wiring layers was difficult.

For this reason, the build-up method, with which an insulating layer and a wiring layer are formed successively one layer at a time on a core wiring substrate, has come to be noted recently as a method of manufacturing multilayer printed wiring boards with high-density wiring layers. With the build-up method, high-density wiring layers can be formed since the electrical connection between respective wiring layers can be realized through shorting parts that extend in the thickness direction through just an insulating layer that exists between the wiring layers.

To be more specific, with the build-up method, an insulating layer, having through holes that correspond to the interlayer shorting parts (vias) that are to be formed, is formed on the surface of a core wiring substrate, and thereafter, conductors, which comprise the interlayer shorting parts, are formed inside the through holes in the insulating layer, a wiring layer is formed on the surface of the insulating layer, and the process is repeated a prescribed number of times to obtain the desired multilayer wiring board.

Known methods of forming the insulating layer with through holes on the surface of a core wiring substrate in the above-described process include the method of coating a liquid radiation-curing resin material on the surface of the core wiring substrate and thereafter performing an exposure treatment and a development treatment on the coated film to form an insulating layer with through holes corresponding to the desired shorting parts (via holes), and the method of coating a liquid thermosetting resin material or setting a sheet-like thermosetting resin material on the surface of the core substrate, performing heat treatment to form the insulating layer, and then illuminating laser light on the insulating layer to form through holes corresponding to the desired interlayer shorting parts.

Further known methods of forming conductors inside the through holes of an insulating layer include the method of forming metal thin films by deposition of metal on the inner surfaces of the through holes of the insulating layer by electroless deposition and then performing electroplating, using the metal thin films as electrodes, to deposit metal and thereby form conductors comprised of metal layers of the required thickness, the method of depositing metal on the inner surfaces of the through holes of the insulating layer by electroless deposition to form conductors comprised of metal layers of the required thickness, the method of filling the interiors of the through holes of the insulating layer with an abovementioned conductive paste, for example, by screen printing or other printing method and then curing the conductive paste to form conductors, with which conductive powder is dispersed within a thermosetting resin, and the like.

However, with the above-described plating methods, since the rate at which a plated film grows from the metal ions is slow, a considerable amount of time is required to form a metal layer of the required thickness in cases where a rather thick conductive film (for example, with a film thickness of 10 $\mu$m or more), a conductive layer that fills the abovementioned through hole, via hole, an abovementioned interlayer shorting part, or the like is to be formed. A high productivity therefore cannot be achieved. Especially with the above-described build-up method, since the interlayer shorting parts, which pass through an insulating layer in its thickness direction, must be formed each time the insulating layer is formed, the slowness of the rate of deposition of metal by plating has a large influence on the productivity.

Also, with methods of forming a conductive layer by coating, printing and the like using a conductive paste or ultrafine metal particle dispersive solution, it is difficult to perform precise control of the thickness of the conductive layer that is obtained, the formation position of the conductive layer and the like. In particular, since a conductive paste that is comprised of resin and conductive powder is relatively high in viscosity (for example, approximately 100 Pa·s at 25° C.) in general, it is difficult to form conductive layers that are high in the precision of formation position, shape and the like. Also in the case where the diameter of the through holes of the insulating layer is small (for example, less than 100 µm in diameter), the interiors of the through holes cannot be filled readily with a conductive paste of such high viscosity, and thus a multilayer wiring board of high connection reliability cannot be obtained.

Also, with the method described in Japanese Unexamined Patent Publication No. Hei-9-134891, though the viscosity of the ultrafine metal particle dispersive solution can be made low, since the dispersion does not contain a resin component, the conductive layer becomes cracked in cases where a thick conductive layer is to be formed. This method also has a problem in that the adhesion of the conductive layer to the substrate is low.

A purpose of the present invention is to provide an aqueous dispersion forming conductive layer, with which a conductive layer of high precision can be formed efficiently by the electrodeposition method, a conductive layer formed from the aqueous dispersion, and an electronic part and a circuit board having the conductive layer.

Another object of the present invention is to provide a highly efficient and highly precise circuit board manufacturing method that includes a process of forming a conductive layer using the abovementioned aqueous dispersion forming conductive layer as the electrodeposition solution.

Yet another object of the present invention is to provide a multilayer wiring board, which is high in productivity and connection reliability, and a manufacturing method thereof.

DISCLOSURE OF THE INVENTION

According to the invention, the above objects are achieved by the provision of an aqueous dispersion forming conductive layer, a conductive layer, an electronic part, a circuit board and a manufacturing method thereof, and a multilayer wiring board and a manufacturing method thereof of the following arrangements.

[1]. An aqueous dispersion forming conductive layer characterized in that conductive microparticles, with a number-average particle diameter of 1 µm or less, and organic particles, which are comprised of at least one of either a polymerizable compound or a polymer, are dispersed in an aqueous medium and in enabling the formation of a conductive layer by electrodeposition.

[2]. An aqueous dispersion forming conductive layer as set forth in [1] above, wherein the volume ratio of the abovementioned conductive microparticles to the abovementioned organic particles is 99:1 to 40:60.

[3]. An aqueous dispersion forming conductive layer as set forth in [1] or [2] above, which is prepared by mixing a conductive microparticle dispersive solution, in which the abovementioned conductive microparticles are dispersed in an organic solvent, and an organic particle dispersive solution, in which the abovementioned organic particles are dispersed in an aqueous medium.

[4]. An conductive layer characterized in being formed by electrodeposition using a aqueous dispersion forming conductive layer as set forth in any one of [1] to [3] above and in that the volume resistivity is $10^{-4}$ Ω·cm or less.

[5]. An electronic part characterized in being equipped in a conductive layer formed by electrodeposition using an aqueous dispersion forming conductive layer as set forth in any one of [1] to [3] above.

[6]. A circuit board characterized in having an insulating layer and a conductive layer, which is formed by an electrodeposition method using an aqueous dispersion forming conductive layer as set forth in any one of [1] to [3] above as an electrodeposition solution and includes conducting through parts that pass through the abovementioned insulating layer.

[7]. A circuit board manufacturing method characterized in using an aqueous dispersion forming conductive layer as set forth in any one of [1] to [3] above and being comprised of;

(a) a process of forming through holes in an insulating layer, (b) a process of setting a conductive foil on a part of one surface of the abovementioned insulating layer that includes the openings at one end of the abovementioned through holes, and (c) a process of forming conducting through parts inside the abovementioned through holes by an electrodeposition method using the abovementioned aqueous dispersion forming conductive layer as the electrodeposition solution and using the abovementioned conductive foil as one of the electrodes.

[8]. A circuit board manufacturing method characterized in using an aqueous dispersion forming conductive layer as set forth in any one of [1] to [3] above and being comprised of;

(a) a process of forming an insulating layer on a core wiring substrate on which a conducting pattern has been formed, (b) a process of patterning the abovementioned insulating layer and forming an insulating layer pattern in through holes that expose a part of the abovementioned conducting pattern, (c) a process of forming an electroless plated layer at parts including the interiors of the abovementioned through holes by electroless deposition using the abovementioned insulating layer pattern as a mask material, and (d) a process of forming a conductive layer, which includes conducting through parts at interiors of the abovementioned through holes, by electrodeposition using the abovementioned aqueous dispersion forming conductive layer as an electrodeposition solution and using the abovementioned conducting pattern and the abovementioned electroless plated layer as one of electrodes.

[9]. A circuit board manufacturing method characterized in that a plurality of circuit boards, obtained by a method set forth in [7] or [8] above, are laminated.

[10]. A multilayer wiring board characterized in having a core wiring substrate, which is arranged by forming substrate wiring layers that are mutually connected electrically on both surfaces of an insulating substrate, an insulating layer, which is laminated onto at least one surface of the core wiring substrate, a wiring layer, which is formed on the abovementioned insulating layer, and interlayer shorting parts, which extend through the abovementioned insulating layer in the thickness direction and electrically connect the abovementioned wiring layer to the abovementioned substrate wiring layer, the abovementioned multilayer wiring board being characterized in that each of the abovementioned interlayer shorting parts is comprised of a conductor, in which conductive microparticles are contained inside a polymer substance, and in that the abovementioned conductor is formed by electrodeposition in an electrodeposition solution, in which conductive microparticles and organic particles, comprised of at least one of either a polymerizable compound or a polymer, are dispersed in an aqueous medium.

[11]. A multilayer wiring board as set forth in [10] above, wherein the abovementioned core wiring substrate has substrate shorting parts, which electrically connect the abovementioned substrate wiring layers, formed on both sides of the abovementioned insulating substrate, to each other and extend through the abovementioned insulating substrate in the thickness direction, each of the abovementioned substrate shorting parts is comprised of a conductor, in which conductive microparticles are contained inside a polymer substance, and the abovementioned conductor is formed by electrodeposition in an electrodeposition solution, in which conductive microparticles and organic particles, comprised of at least one of either a polymerizable compound or a polymer, are dispersed in an aqueous medium.

[12]. A multilayer wiring board as set forth in [10] or [11] above, wherein the proportion as volume percentage of the abovementioned conductive microparticles in the abovementioned conductors that comprise the abovementioned interlayer shorting parts and/or substrate shorting parts is 40 to 99%.

[13]. A method of manufacturing a multilayer wiring board as set forth in any of [10] to [12] above, characterized in being comprised of;

a process of preparing a core wiring substrate member, which is comprised of an insulating substrate, a substrate wiring layer, formed on one surface of the abovementioned insulating substrate, and a metal layer, formed on the other surface of the abovementioned insulating substrate and electrically connected to the abovementioned substrate wiring layer, a process of forming an insulating layer, having through holes formed in correspondence to interlayer shorting parts to be formed on the substrate wiring layer, on one surface of the abovementioned core wiring substrate member, and a process of forming conductors that comprise the abovementioned interlayer shorting parts inside the abovementioned through holes of the abovementioned insulating layer by electrodeposition using an electrodeposition solution, in which conductive microparticles and organic particles comprised of at least one of either a polymerizable compound or a polymer, are dispersed in an aqueous medium, with the abovementioned substrate wiring layer of the core wire substrate member on which the abovementioned insulating layer was formed, as a deposition electrode.

[14]. A multilayer wiring board manufacturing method as set forth in [13] above, wherein a substrate forming material, having an insulating substrate and a metal layer, formed on at least one surface of the abovementioned insulating substrate, is prepared, through holes, which pass through the abovementioned insulating substrate of the abovementioned substrate forming material in the thickness direction thereof, are formed, and after performing electrodeposition, using the abovementioned metal layer of the abovementioned substrate forming material as the deposition electrode, in an electrodeposition solution, in which conductive microparticles and organic particles comprised of at least one of either a polymerizable compound or a polymer, are dispersed in an aqueous medium, to form conductors that comprise substrate shorting parts inside the abovementioned through holes of the abovementioned insulating substrate, a substrate wiring part is formed on one surface of the abovementioned insulating substrate to form the abovementioned core wiring substrate member.

[15]. A multilayer wiring board manufacturing method as set forth in [13] or [14] above, wherein the volume ratio of the abovementioned conductive microparticles to the abovementioned organic particles is 99:1 to 40:60.

The invention shall now be described in further detail.

(a)Conductive Microparticles

Though the material that comprises the conductive microparticles used in the invention is not restricted in particular as long as it exhibits conductivity, a material that is not oxidized readily is preferable in that stable conductivity can be provided over a long term. Specific examples of such a material includes a metal selected from among gold, silver, copper, aluminum, zinc, nickel, palladium, platinum, cobalt, rhodium, iridium, iron, ruthenium, osmium, chromium, tungsten, tantalum, titanium, bismuth, lead, boron, silicon, tin, barium and alloys of these metals and the like. Two or more types of conductive materials made of differing materials ray also be used in combination. The conductive microparticles are preferably comprised of a material with a volume resistivity of $10^{-5}$ $\Omega \cdot cm$ or less and are more preferably comprised of a material with a volume resistivity of $7 \times 10^{-6}$ $\Omega \cdot cm$ or less.

In the invention of the first to ninth claims, the number-average particle diameter of the abovementioned conductive microparticles must be 1 $\mu m$ or less and is preferably 0.5 $\mu m$ or less and more preferably 0.3 $\mu m$ or less. When the number-average particle diameter exceeds 1 $\mu m$, the particles tend to settle readily in the aqueous dispersion forming conductive layer of the invention and the storage stability of the aqueous dispersion will be inadequate. Though the lower limit of the number-average particle diameter is not restricted in particular, it is normally 0.02 $\mu m$ or more. The conductive microparticles of the tenth to fifteenth claim of the invention also preferably have a number-average particle diameter in the range given above. In the specification, "particle diameter" shall refer to the primary particle diameter.

Metal microparticles, produced by the gas phase vaporization method, electrolysis method, reduction method and the like, are favorably used as the conductive microparticles due to the ease of production.

The conductive particles having a spherical shape, angular shape, scale-like shape, spike-like shape and the like may be used as the conductive particles of the invention. Among these, the conductive particles of angular shape or scale-like shape are especially preferable in that the inter-particle contact area will be high.

(b) Organic Particles
(b-i) Composition of Organic Particles

The organic particles in the invention are comprised of "at least one of either a polymerizable compound or a polymer." Here, a "polymerizable compound" refers to a compound having a polymerizable group and refers inclusively to precursor polymers prior to complete curing, polymerizable oligomers, monomers or the like. On the other hand, "polymer" refers to a compound for which the polymerization reaction has been practically completed. The polymer may also be one that can be crosslinked after electrodeposition by means of heat, moisture and the like.

The abovementioned organic particles preferably have an electrical charge on the surface in order to enable electrodeposition. The surface charge may be anionic or cationic. In the case where the material of the conductive microparticles is copper, the surface charge of the organic particles is preferably cationic since the preservation stability of the aqueous dispersion that contains these particles will then be better.

The abovementioned organic particles are preferably comprised of at least one type of substance or two or more types of substances selected from among acrylic-based resins, epoxy-based resins, polyester-based resins, and polyimide-based resins. The organic particles may contain other components in addition to these resins. These resins may also be chemically bonded to each other or to other components.

In the invention, in the case where the resin component is to be decomposed and eliminated by heating or the like after electrodeposition, the use of organic particles having an acrylic-based resin as the principal component is especially preferable. On the other hand, if the elimination by decomposition is not to be performed, the use of the organic particles having polyimide-based resin as the principal component is especially preferable since a conductive layer that is excellent in mechanical characteristics, chemical characteristics, and electrical characteristics can then be formed readily. Here, "polyimide-based resin" refers inclusively to polyimide resins, precursor polymers that can be cured by heating after electrodeposition (for example, polyamic acid and the like), copolymer resins of a monomer used in forming a polyimide resin and another monomer and precursor polymers of such copolymer resins, reaction products of a polyimide resin or a precursor polymer of a polyimide resin and another compound, monomers and oligomers used in forming polyimide-based resins or the like. The same applies to the other resins as well.

(b-2) Aqueous Emulsion of Organic Particles

An aqueous dispersion of the invention is normally prepared using an aqueous emulsion in which the above-described organic particles are dispersed in an "aqueous medium."

In the following, the methods of producing an aqueous emulsion of organic particles mainly comprised of acrylic-based resin (referred to hereinafter as "acrylic-based resin emulsion"), an aqueous emulsion of organic particles mainly comprised of epoxy-based resin (referred to hereinafter as "epoxy-based resin emulsion"), an aqueous emulsion of organic particles mainly comprised of polyester-based resin (referred to hereinafter as "polyester-based resin emulsion"), and an aqueous emulsion of organic particles mainly comprised of polyimide-based resin (referred to hereinafter as "polyimide-based resin emulsion") shall be described.

(i) Method of Producing an Acrylic-based Resin Emulsion

The method of producing an acrylic-based resin emulsion is not restricted in particular, and such an emulsion can for example be produced by the ordinary emulsion polymerization method, by the method of adding a reaction solution, with which polymerization has been carried out in alcohol or other organic solution, to water while stirring to disperse the resin and the like. As the monomer, one or two or more types of monomers selected from among generally used acrylic and/or methacrylic monomers may be used. In order to enable electrodeposition of the organic particles that are obtained, a monomer having a cationic group or anionic group is usually copolymerized. The copolymerization ratio is preferably set to 5 to 80% by weight (or more preferably 10 to 50% by weight) of the total amount of monomers used.

(ii) Method of Producing an Epoxy-based Resin Emulsion

The method of producing an epoxy-based resin emulsion is not restricted in particular and priorly known methods, for example, the methods disclosed in Japanese Unexamined Patent Publication No. Hei-9-235495, ibid. No. Hei-9-208865 may be used.

(iii) Method of Producing a Polyester-based Resin Emulsion

The method of producing a polyester-based resin emulsion is not restricted in particular and priorly known methods, for example, the methods disclosed in Japanese Unexamined Patent Publication No. Sho-57-10663, ibid. No. Sho-57-70153, ibid. No. Sho-58-174421, may be used.

(iv) Method of Producing a Polyimide-based Resin Emulsion

The method of producing a polyimide-based resin emulsion is not restricted in particular and the following two types of emulsions and methods may be given as examples of polyimide-based resin emulsions and production methods thereof that can be used favorably in the invention.

(1) A polyimide-based resin emulsion comprised of composite particles of (A) a polyimide that is soluble in an organic solvent and (B) a hydrophilic polymer. The type of polyimide-based resin emulsion can be produced favorably for example by the method described in Japanese Unexamined Patent Publication No. Hei-11-49951.

(2) A polyimide-based resin emulsion comprised of composite particles of (C) a polyamic acid and (D) a hydrophobic compound. The type of polyimide-based resin emulsion can be produced favorably for example by the method described in Japanese Unexamined Patent Publication No. Hei-11-60947.

These polyimide-based emulsions are excellent in preservation stability as aqueous dispersions and favorable in that by electrodeposition of the particles in the emulsion, an electrodeposited film can be formed with which the inherent heat resistance, electrical insulation, chemical resistance or the like of polyimide are maintained.

Methods of producing a polyimide-based resin emulsion used in (1) above shall now be described in more detail.

The method of synthesizing the "(A) polyimide that is soluble in an organic solvent" is not restricted in particular, and the polyimide may be synthesized for example by mixing and condensation polymerizing a tetracarboxylic dianhydride with a diamine compound to obtain a polyamic acid and then subjecting the polyamic acid to a dehydration ring-closing reaction by thermal imidization or chemical imidization. A polyimide with a block structure may also be synthesized by performing condensation polymerization of a tetracarboxylic dianhydride with a diamine compound in multiple stages.

The polyimide soluble in organic solvent preferably has one or more reactive groups (a), for example, the carboxyl group, amino group, hydroxyl group, sulfonic group, amide group, epoxy group, isocyanate group and the like.

Examples of methods of synthesizing a polyimide with a reactive group (a) include the method of using a compound having the reactive group (a) as the carboxylic dianhydride, diamine compound, carboxylic monoanhydride, monoamine compound, or other reaction raw material used in the synthesis of polyamic acid and keeping the reactive group (a) after the dehydration ring-closing reaction.

The "(B) hydrophilic polymer" is comprised of a hydrophilic polymer having one or more types of hydrophilic groups, such as the amino group, carboxyl group, hydroxyl group, sulfonic group, amide group or the like, and having a solubility in water at 20° C. of normally 0.01 g/100 g or more and preferably 0.05 g/100 g or more. In addition to the abovementioned hydrophilic group, the hydrophilic polymer preferably has one or more reactive groups (b) that can react with the reactive group (a) in the above-described component (A). Examples of such a reactive group (b) include the epoxy group, isocyanate group, carboxyl group, as well as the same groups given above as hydrophilic groups. Such a hydrophilic polymer can be obtained by homopolymerization or copolymerization of a monovinyl monomer or monovinyl monomers with the hydrophilic group and/or reactive group (b) or by copolymerizing such a monovinyl monomer with another type of monomer.

The (A) polyimide that is soluble in an organic solvent and the (B) hydrophilic polymer are selected so that the resulting combination will be one with which the reactive group (a) and the reactive group (b) in the hydrophilic polymer will exhibit an appropriate reactivity, and the polylmide and the hydrophilic polymer are mixed in solution form in an organic solvent for example and heated as necessary to cause the two components to react. The reaction solution is then mixed with an aqueous medium, and depending on the case, at least part of the organic solvent is removed to obtain a polyimide-based resin emulsion comprised of composite particles with which the polyimide and the hydrophilic polymer are contained in the same particle in a mutually bonded condition.

Methods of producing a polyimide-based resin emulsion used in (2) above shall now be described in more detail.

The method of synthesizing the "(C) polyamic acid," which is the precursor of polyimide, is not restricted in particular, and the polyamic acid may be obtained by subjecting a tetracarboxylic dianhydride and a diamine compound to condensation polymerization in a polar organic solvent. A polyamic acid with a block structure may also be synthesized by performing condensation polymerization of a tetracarboxylic dianhydride with a diamine compound in multiple stages. A polyamic acid, which has been partially imidized by dehydration ring-closing of a polyamic acid, may also be used.

Meanwhile, the "(D) hydrophobic compound" is a compound having a group (referred to hereinafter as the "reactive group") that can react with at least the amic acid group in the above-described polyamic acid. Examples of the reactive group include the epoxy group, isocyanate group, carbodiimide group, hydroxyl group, mercapto group, halogen group, alkyl sulf onyl group, aryl sulfonyl group, diazo group, carbonyl group and the like. One or more such reaction groups may exist in the hydrophobic compound. "Hydrophobic" normally signifies that the solubility in water at 20° C. is less than 0.05 g/100 g, and the solubility is preferably less than 0.01 g/100 g and more preferably less than 0.005 g/100 g.

One or two or more types of compounds selected for example from among epoxidized polybutadienes, bisphenol A type epoxy resins, naphthalene-based epoxy resins, fluorene-based epoxy resins, biphenyl type epoxy resins, glycidyl ester type epoxy resins, aryl glycidyl ethers, glycidyl (meth)acrylate, 1,3,5,6-tetraglycidyl-2,4-hexanediol, N,N,N',N'-tetraglycidyl-m-xylenediamine, tolylene diisocyanate, dicyclohexylcarbodiimide, polycarbodiimide, cholesterol, benzyl alcohol p-toluenesulfonic acid ester, ethyl chloroacetate, triazine trithiol, diazomethane, diacetone (meth)acrylamide and the like may be used.

This (C) polyamic acid and (D) hydrophobic compound are reacted, for example, upon mixing in a solution condition in an organic solvent. The reaction solution is then mixed with an aqueous medium, and, depending on the case, at least part of the organic solvent is removed to obtain a polyamic acid-based resin emulsion comprised of composite particles with which the polyamic acid and the hydrophobic compound are contained in the same particle.

The tetracarboxylic dianhydride used in the above-described methods of (1) and (2) is not restricted in particular, and examples include aliphatic tetracarboxylic dianhydrides and alicyclic tetracarboxylic dianhydrides, such as butanetetracarboxylic dianhydride, 1,2,3,4-cyclobutanetetracarboxylic dianhydride, 3,3',4,4'-dicyclohexyltetracarboxylic dianhydride, 2,3,5-tricarboxycyclopentylacetic dianhydride, 1,3,3a,4,5,9b-hexahydro-5-(tetrahydro-2,5-dioxo-3-furanyl)-naphtho[1,2-c]-furan-1,3-dione or the like; and aromatic tetracarboxylic dianhydrides, such as pyromellitic dianhydride, 3,3', 4,4'-benzo- phenonetetracarboxylic dianhydride, 3,3', 4,4'-biphenyl- sulfonetetracarboxylic dianhydride or the like. These tetracarboxylic dianhydrides may be used solitarily or two or more of these tetracarboxylic dianhydrides may be used in mixed form.

The diamine compound used in the above-described methods of (1) and (2) is not restricted in particular, and examples include aromatic diamines, such as p-phenylenediamine, 4,4'-diaminodiphenylmethane, 2,2-bis [4-(4-aminophenoxy)phenyl]propane or the like;

alicyclic diamines, such as 1,1-metaxylilenediamine, 1,3-propanediamine, tetramethylenediamine, 4,4'-methylene-(bis(cyclohexylamine) or the like;

diamines having two primary amino groups and nitrogen atoms besides those of the primary amino groups in the molecule, such as 2,3-diaminopyridine, 2,4-diamino-6-dimethylamino-1,3,5-triazine, 2,4-diamino-5-phenylthiazole, bis(4-aminophenyl)phenylamine or the like;

monosubstituted phenylenediamines; and diamino organosiloxanes.

These diamine compounds may be used solitarily or two or more such compounds may-be used in mixed form.

(c)Aqueous Dispersion

An aqueous dispersion of the invention has the above-described conductive microparticles and the above-described organic particles dispersed in an aqueous medium. In the specification, "aqueous medium" refers to a medium containing water, and the water content of the aqueous medium is normally 0.5% by weight or more and preferably 10% by weight or more. A water content of less than 0.5% by weight or more is unfavorable as it will be difficult to use such an aqueous dispersion directly as an electrodeposition solution. On the other hand, since the dispersion stability of the conductive microparticles and the like will be lowered when the water content is too high, the water content is preferably 50% by weight or less, more preferably 40% by weight or less, and even more preferably 20% by weight or less.

Examples of other media used as necessary along with water include the nonprotonic polar solvents used in the above-described production of polyamic acid or polyimide, esters, ketones, phenols, alcohols, amines or the like. Among these, an alcohol comprised of one or two or more types of alcohols with 1 to 10 carbon atoms is preferably contained at an amount of 10 to 90% by weight (more preferably 20 to 70% by weight) from the point of dispersion stability of the metal microparticles to serve as conductive microparticles. Also, the aqueous medium preferably contains an amine, such as monoethanolamine, diethanolamine and the like, at an amount of 0.01 to 5% by weight (more preferably 0.1 to 1% by weight), and the dispersion stability is thereby improved.

The volume ratio of conductive microparticles to organic particles contained in the aqueous dispersion is preferably in the range of 99:1 to 40:60, more preferably in the range of 95:5 to 40:60, and even more preferably in the range of 85:15 to 60:40. When the proportion of the total amount of conductive microparticles and organic particles that is comprised by the conductive microparticles is less than 40% by volume, the volume resistivity will be too great and the conductive layer will not be fit for practical use. Meanwhile, if the proportion of the conductive microparticles exceeds 80% by volume, the film forming property, shape maintaining property, adhesion to the substrate or the like will tend to be inadequate and cracks may form in the conductive layer.

The pH of the aqueous dispersion is preferably 3 to 12 (more preferably 4 to 10), the solids concentration is preferably 1 to 50% by weight (more preferably 5 to 30% by weight), and the viscosity at 20° C. is preferably 1 to 100 mPa·s. When the pH, solids concentration, or viscosity fall outside these ranges, the storage stability may become poor due to poor dispersion of the particles, the productivity may be lowered due to an inadequate rate of electrodeposition, workability in handling and use may be lowered, and electrodeposition onto parts of fine shape, such as the interiors of the through holes, may become difficult.

The aqueous dispersion is favorably prepared by mixing a conductive microparticle dispersive solution, with which the above-described conductive microparticles are dispersed in an organic solvent, and an organic particle dispersive solution (preferably an above-described aqueous emulsion), with which the above-described organic particles are dispersed in an aqueous medium.

As the organic solvent to be used in the abovementioned "conductive microparticle dispersive solution," an alcohol-based solvent, comprised of one or two or more types of alcohols with 1 to 10 carbon atoms, is preferable in terms of dispersion stability, solubility in the medium of the aqueous dispersion or the like, and ethyl alcohol, isopropyl alcohol, or a mixed solvent of these is used especially preferably. Methods of dispersing the conductive microparticles in the organic solvent include methods of using a homomixer, high-pressure homogenizer, ultrasonic mixer or the like and methods in which these are combined. The conductive microparticle dispersive solution contains the conductive microparticles at an amount of preferably 3 to 40% by weight and more preferably 5 to 30% by weight.

In addition to the above-described conductive microparticles and above-described organic particles, an aqueous dispersion of the invention may contain at least one type of compound (referred to hereinafter as "organosilane condensate, etc.") selected from among organosilanes expressed by the formula (1) given below, hydrolyzates, with which all or part of the hydrolyzable groups of such an organosilane have been hydrolyzed, and partial condensates, resulting from the partial dehydration condensation of such hydrolyzates. Especially in the case where curing by heat is performed after electrodepOSition, the conductive layer that is formed from such an aqueous dispersion is made excellent in mechanical characteristics and chemical characteristics by the crosslinking of the organosilane condensate, etc. in the conductive layer.

$$(R^1)_n Si(OR^2)_{4-n} \tag{1}$$

(In the above formula, $R^1$ indicates the hydrogen group or a monovalent organic group with 1 to 8 carbons, $R^2$ indicates an alkyl group with 1 to 5 carbon atoms, an acyl group with 1 to 6 carbons, or the phenyl group, and n is an integer of value 1 or 2. $R^1$ and $R^2$ may be the same or may differ from each other.)

Examples of the organic group with 1 to 8 carbons of $R^1$ in the above formula (1) include straight-chain and branched alkyl groups, halogenated alkyl groups, vinyl groups, phenyl group, 3,4-epoxycyclohexylethyl group and the like. $R^1$ may contain a carbonyl group. $R^1$ is preferably an alkyl group with 1 to 4 carbons or the phenyl group.

Examples of the alkyl group with 1 to 5 carbons or acyl group with 1 to 6 carbons of $R^2$ include the methyl group, ethyl group, n-propyl group, isopropyl group, n-butyl group, isobutyl group, sec-butyl group, tert-butyl group, n-pentyl group, acetyl group, propionyl group, butyryl group and the like. $R^2$ is preferably an alkyl group with 1 to 4 carbons.

Examples of preferably used organosilanes include dimethyldimethoxysilane, dimethyldiethoxysilane, isobutyltrimethoxysilane, and phenyltriethoxysilane. Just one such organosilane may be used or two or more such organosilanes may be used in combination.

The above-described "organosilane condensate, etc." preferably forms a composite particle with the above-described organic particle in an aqueous dispersion of the invention. Here, "composite particle" refers to a particle in which the compound that comprises the above-described organic particle is chemically bonded to the organosilane condensate, etc., a particle with which the organosilane condensate, etc. is adsorbed on the surface or interior of the above-described organic particle and the like.

The usage amount of the organosilane condensate is preferably 0.1 to 500 weight parts and more preferably 0.5 to 250 weight parts to 100 weight parts of the above-described organic particles. When the usage amount of the organosilane condensate, etc. is less than 0.1 weight parts, the desired effects may not be obtained, and when the usage amount of the organosilane condensate, etc. is greater than 500 weight parts, the adhesive property of the conductive layer and the like tends to be lowered.

Such composite particles may be produced by the following method (1) or (2) or the like. These methods may also be combined.

[1] An abovementioned organosilane is added to an emulsion of the above-described organic particles, and after making at least part of the organosilane be absorbed by the above-described organic particles, hydrolysis and condensation of the organosilane are made to proceed.

[2] A reaction that generates the above-described organic particles is carried out under the presence of an abovementioned organosilane condensate, etc., which has been dispersed in an aqueous medium.

In order to make an organosilane be absorbed by the organic particles in the above-described method [1], the organosilane may be added to an emulsion and stirred adequately. In this case, preferably 10% by weight or more (more preferably 30% by weight or more) of the added organosilane is made to be absorbed by the particles. In order to prevent progress of the hydrolysis and condensation of the organosilane at a stage at which absorption is inadequate, the pH of the reaction system may be adjusted to normally 4 to 10, preferably 5 to 10, and more preferably 6 to 8. The treatment temperature for making the organosilane be absorbed by the organic particles is set preferably to 70° C. or less, more preferably to 50° C. or less, and even more preferably to 0 to 30° C. The duration of treatment is normally set to 5 to 180 minutes and preferably set to approximately 20 to 60 minutes.

The temperature at which the absorbed organosilane is hydrolyzed and condensed is normally 30° C. or more, preferably 50 to 100° C., and more preferably 70 to 90° C. The duration of polymerization is preferably 0.3 to 15 hours and more apreferably 1 to 8 hours.

In the above-described method [2], the abovementioned organosilane is mixed in an aqueous solution of a strongly acidic emulsifier, such as an alkylbenzenesulfone, using a homomixer or an ultrasonic mixer or the like and thereby hydrolyzed and condensed to obtain an organosilane condensate or the like that is dispersed in an aqueous medium. Under the presence of the organosilane condensate, etc., the above-described organic particles are formed, preferably by emulsion polymerization.

(d)Conductive Layer

Though an aqueous dispersion of the invention is normally used in its original concentration as the electrodeposition solution for forming the conductive layer, it may also be diluted or concentrated. A priorly-known additive may also be blended suitably as necessary. By a normal electrodeposition method using the electrodeposition solution, the conductive microparticles and the organic particles in the aqueous dispersion can be electrodeposited onto an electrode surface and the like to produce a conductive layer.

After the electrodeposition process, the electrical resistance of the conductive microparticle interface is lowered by the following methods.

$\hat{1}$ In order to eliminate metal oxides and other non-conductive substances that exist on the surface of the conductive microparticles, the layer formed by electrodeposition is baked under a reducing atmosphere. For example, metal oxides can be reduced by baking at a temperature of 200 to 500° C. for 30 to 180 minutes under an inert gas atmosphere having 0.1 to 5% by volume of hydrogen mixed in. The surface of this layer may also be washed by a weakly acidic, 50 to 100% aqueous solution of acetic acid, formic acid, propionic acid or the like to eliminate the metal oxides and other non-conductive substances by dissolution.

$\hat{2}$ A metal is deposited onto the surface of the conductive microparticles. A metal can be deposited efficiently onto the microparticle interface by immersion in an electroplating solution and application of a current in the form of pulses. The proportion of the conduction time with respect to a single pulse cycle is set preferably to 0.6 or less and more preferably to 0.3 or less. Known metals, such as copper, nickel, gold, platinum, silver, tin, solder alloy and the like may be used as the metal to be electroplated.

The resin component of the electrodeposited particles may also be eliminated by decomposition to lower the volume resistivity of the conductive layer. In this case, an acrylic-based resin, which can be eliminated by decomposition at a relatively low temperature, is preferably used as the resin component, and the resin component can be eliminated substantially by heating at 200 to 800° C. for 30 to 180 minutes. In the case where the layer is baked under a reducing atmosphere as has been described above, the resin component can be eliminated by decomposition at the same time as this baking.

Also, a thermosetting resin may be used as the resin component and the resin component may be cured by heating further after electrodeposition. In this case, an aqueous dispersion containing the abovementioned organosilane condensate, etc. is preferably used. An epoxy-based resin or a polyimide-based resin is preferably used as the thermosetting resin, and the use of a polyimide-based resin is most preferable. Though the thermosetting conditions are not restricted in particular as long as the temperature is not one at which the resin component will be eliminated by decomposition, the heating temperature is preferably 100 to 400° C. and more preferably 150 to 300° C. The heating duration is preferably 5 minutes or more and more preferably 10 minutes or more. By thermosetting the resin component, the mechanical characteristics of the conductive layer is improved, and by the quenching, the conductive layer is made dense, thereby improvingtheelectricalcharacteristics. Furthermore, since the resin component that remains in the conductive layer functions as a binder, a conductive layer that is excellent in adhesive property, impact resistance and the like can be formed. In the case where the film is to be baked under a reducing atmosphere as has been described above, the resin component may be thermoset using the heat of baking.

According to the aqueous dispersion of the invention, a conductive layer with a volume resistivity of $10^{-4}$ $\Omega\cdot$cm or less (or more preferably $0.5\times 10^{-4}$ $\Omega\cdot$cm or less) can be obtained. In the case where the conductive layer is to be formed as a film, the thickness thereof is preferably 1 to 80 $\mu$m (more preferably 3 to 50 $\mu$m and even more preferably 5 to 20 $\mu$m). This is because the advantages of production by electrodeposition using an aqueous dispersion of the invention are exhibited effectively in the forming of a conductive layer with a thickness within this range.

(e)Electronic Part

According to the aqueous dispersion of the invention, a conductive layer of high precision of film thickness and the like can be produced efficiently. A conductive layer can also be formed efficiently at high precision at parts of fine shapes, such as the through holes, via holes and the like that are made through the insulating layer. The conductive layer is favorably applied to electronic parts such as conductive circuits, bumps, and wiring substrates made by combining such components (for example, multilayer circuit boards).

(f)Circuit Board (f-1) Arrangement

A circuit board of the invention is equipped with an insulating layer and a conductive layer, which is formed using the above-described aqueous dispersion forming conductive layer. A part of the conductive layer comprises the conducting through parts that pass through the abovementioned insulating layer.

The material that comprises the insulating layer is not restricted in particular, and polyimide resin, epoxy-based resin, bismaleimide-based resin, phenol-based resin and the like may be used in accordance to the application of the circuit board that is obtained. For example, a glass epoxy substrate, BT resin substrate or the like, which is generally used as a core substrate in a build-up wiring board, or an epoxy-based resin layer, polyimide-based resin layer or the like, which is used as an insulating layer in a build-up wiring board, may be used favorably. Though the thickness of insulating layer is also not restricted in particular, it is normally 20 to 150 μm (preferably 50 to 100 μm) in the case of a core substrate and normally 5 to 100 μm (preferably 10 to 50 μm) in the case of a build-up insulating layer.

A polyimide-based resin layer comprised of a polyimide-based composite with an elastic modulus of less than 10GPa is especially favorably used as the polyimide-based resin layer to be employed as the insulating layer. As such a polyimide-based composite, a composite, comprised of a (A) polyimide component and (B) another polymer component as disclosed in laid-open Japanese patent publication No. 2000-44800, may be used. The (A) polyimide component is preferably soluble in an organic solvent, and a polyimide with a block structure, a terminal-modified polyimide, a polyimide, polyamic acid or the like with a reactive group can be used favorably. The (B) other polymer component preferably has a reactive group that can react directly or indirectly via a crosslinking agent with the (A) polyimide component. Specific examples of the (B) other polymer component include acryl polymers and other polymers of vinyl monomers, natural rubbers and epoxidized products thereof, polybutadienes and epoxidized products thereof, styrene-butadiene rubbers, isoprene rubbers, urethane rubbers, acrylonitrile rubbers, ethylene-propylene rubbers, fluoropolymers, silicone polymers and the like.

The abovementioned conducting through parts are normally formed so as to fill up the through holes that pass through the abovementioned insulating layer or are formed as films that line the wall surfaces of the through holes. The diameter of a through hole is preferably 4 to 150 μm (more preferably 6 to 100 μm and even more preferably 10 to 90 μm). This is because with a through hole with a diameter in this range, the advantages of forming a conducting through part in the interior thereof by electrodeposition using an aqueous dispersion of the invention are exhibited effectively. In the case where the conducting through part is formed as a film that lines the wall surface of a through hole, the film thickness thereof is preferably 1 to 50 μm (more preferably 2 to 301 μm and even more preferably 3 to 20 μm).

(f-2) Manufacturing Method

The above-described circuit board can be manufactured for example by the method of the seventh claim (this method shall also be referred to hereinafter as "Method 1"). The manufacturing process of this method shall now be described with reference to FIG. 1.

First, as shown in FIG. 1(a), through holes 411 are formed in an insulating layer 41. Next, as shown in FIG. 1(b), a conductive foil 42 is laminated onto one surface 41a of insulating layer 41. The conductive foil 42 may cover the entirety or just a part of surface 41a but is provided at least at a part that includes the openings at one end of through holes 411. That is, parts of conductive foil 2 form the bottom surfaces 421 of through holes 411. Thereafter, the substrate shown in FIG. 1(b) is immersed in and made to contact an electrodeposition solution, comprised of an aqueous dispersion as set forth in any of the first to third claims, so that the electrodeposition solution fills the through holes 411, and electrodeposition is then performed using conductive foil 42 as one of the electrodes. Conductive microparticles and organic particles are thereby electrodeposited onto the bottom surfaces 421 as shown in FIG. 1(c) and conducting through parts 431 are formed inside through holes 411.

Thereafter, another conductive foil 42 is laminated onto the other surface 41b of insulating layer 41 for example as shown in FIG. 1(d) and conductive foils 42 are etched by a priorly-known method to form a conducting patterns 44. A circuit board, with which a conducting pattern 44, formed on surface 41a, and a conducting pattern 44, formed on surface 41b, are connected by conducting through parts 431 as shown in FIG. 1(e) is thereby obtained. By appropriately heating the board in a suitable process after electrodeposition, the resin that forms conducting through parts 431 may be thermoset, and in the case where insulating layer 41 is comprised of a semi-cured resin, this can be thermoset at the same time at the stage.

The circuit board of the invention may also be manufactured by the method of the eighth claim (also referred to hereinafter as "Method 2"). The manufacturing process of this method shall now be described with reference to FIG. 2.

A conductive layer is formed on a core wiring substrate on which conducting patterns have been formed in advance with Method 2. As the core wiring substrate, a core wiring substrate 48, which as shown in FIG. 2(a) is equipped with an insulating layer (also referred to as "core insulating layer") 41, conducting pattern 44, and conducting through parts 431 and was manufactured by the processes or the like illustrated in FIGS. 1(a) to (e), may be used.

As shown in FIG. 2(b), insulating layers 45 are formed on both surfaces of core wiring substrate 48 by coating of a photosensitive insulating resin. By patterning the layer with a known method, insulating layer patterns 46, with through holes 451 that expose parts of conducting patterns 44, are formed as shown in FIG. 2(c). Next as shown in FIG. 2(d), insulating layer patterns 46 are used as mask materials in forming electroless plated layers 47 by electroless deposition with a known method. Though these electroless plated layers 47 may be formed on the entire surface or just part of the substrate shown in FIG. 2(c), they are formed at parts that at least include the interiors of through holes 451 so as to be electrically connected with the conducting patterns 44 positioned at the bottoms of through holes 451.

Thereafter, the substrate shown in FIG. 2(d) is immersed in and made to contact an electrodeposition solution, comprised of an aqueous dispersion as set forth in any of the first to third claims, so that the electrodeposition solution fills the through holes 451 and electrodeposition is then performed using electroless plated layers 47 as one of the electrodes. Conductive microparticles and organic particles are thereby electrodeposited onto the electroless plated layers 47 as shown in FIG. 2(e), thereby forming conducting layers 43 that include the conducting through parts 432 formed inside through holes 451.

For the substrate shown in FIG. 2(e), a circuit board obtained by the method of the eighth claim is laminated on each of the surfaces of a circuit board obtained by the method of the seventh claim. By performing the patterning of conductive layers 43 from the condition and thereafter repeating the processes of FIGS. 2(b) to (e), circuit boards obtained by the method of the eighth claim can be laminated further. Also, a plurality of just the circuit boards obtained by the method of the seventh claim may be laminated, a plurality of just the circuit boards obtained by the method of the eighth claim may be laminated, or a single or a plurality of circuit boards obtained by the method of eighth claim may be laminated on just one surface of a circuit board obtained by the seventh claim.

(g)Multilayer Wiring Board

The arrangement and manufacturing method of the multilayer wiring board disclosed in the tenth to fifteen claim shall now be described.

(g-1) Arrangement

FIG. 3 is an explanatory sectional view, which shows the arrangement of an example of a multilayer wiring board of the invention. The multilayer wiring board has a core wiring substrate 10, and with the core wiring substrate 10, a first substrate wiring layer 12 is formed on the upper surface of an insulating substrate 11, a second substrate wiring layer 13 is formed on the lower surface of insulating substrate 11, and the first substrate wiring layer 12 and second substrate wiring layer 13 are electrically connected to each other via substrate shorting parts 14 that extend through insulating substrate 11 in its thickness direction.

An upper insulating layer 20 is formed on the upper surface of core wiring substrate 10, an upper wiring layer 21 is formed on the upper surface of upper insulating layer 20, and the upper wiring layer 21 is electrically connected to first substrate wiring layer 12 via interlayer shorting parts 22 that extend through upper insulating layer 20 in its thickness direction. A solder resist layer 25, which has openings 26 that expose lands for connection of parts on upper wiring layer 21, is provided on the upper surface of upper insulating layer 20, which includes upper wiring layer 21.

Meanwhile, a lower insulating layer 30 is formed on the lower surface of core wiring substrate 10, a lower wiring layer 31 is formed on the lower surface of lower insulating layer 30, and the lower wiring layer 31 is electrically connected to second substrate wiring layer 13 via interlayer shorting parts 32 that extend through lower insulating layer 30 in its thickness direction. A solder resist layer 35, which has openings 36 that expose lands for connection of parts on lower wiring layer 31, is provided on the upper surface of lower insulating layer 30, which includes lower wiring layer 31.

An insulating resin material of high heat resistance is preferably used as the material that comprises the insulating substrate 11 of core wiring substrate 10. Specific examples include glass fiber reinforced epoxy resins, glass fiber reinforced polyimide resins, glass fiber reinforced phenol resins, glass fiber reinforced bismaleimide triazine resins, polyimide resins, polyamide resins, polyester resins and the like.

As substrate shorting parts 14, though shorting parts of various arrangements used in prior-art printed wiring boards, such as shorting parts comprised of cylindrical metal deposits formed by electroless deposition or electroplating, shorting parts comprised of cured conductive paste material, with which conductive particles are dispersed in a thermosetting resin material and the like may be used, it is preferable to use shorting parts, which are comprised of the material that comprises interlayer shorting parts 22 and interlayer shorting parts 32 to be described below, in other words, shorting parts comprised of conductors formed by electrodeposition in an electrodeposition solution, with which conductive microparticles and organic microparticles, which are comprised of at least one of either a polymerizable compound or a polymer, are dispersed in an aqueous medium.

Various thermosetting resin materials and radiation-curing resin materials used in prior-art printed wiring boards may be used as the material that comprises the upper insulating layer 20 and the lower insulating layer 30.

The interlayer shorting parts 22 and 32 formed in upper insulating layer 20 and lower insulating layer 30 are comprised of conductors, with which conductive microparticles are contained in a polymer substance, and these conductors are formed by electrodeposition in a specific electrodeposition solution.

The specific electrodeposition solution for forming interlayer shorting parts 22 and 32, is that conductive microparticles and organic particles which are comprised of at least one of either a polymerizable compound or a polymer are dispersed in an aqueous medium. An aqueous dispersion forming conductive layer as set forth in any of the first to third claims is especially preferable for use as the electrodeposition solution.

Such interlayer shorting parts 22 and 32 contain conductive microparticles at an amount as volume percentage of preferably 40 to 99% and more preferably 60 to 95%.

By satisfying the above conditions, interlayer shorting parts 22 and 23, with a high conductivity, that is for example, with a volume resistivity of preferably $1 \times 10^{-4} \Omega$ or less and more preferably $0.5 \times 10^{-4} \Omega$ or less, can be formed without fail.

(g-2) Manufacturing Method

An above-described multilayer wiring board can be manufactured for example in the following manner.

First, as shown in FIG. 4, a core wiring substrate member 10A is prepared with which a first substrate wiring layer 12 is formed on the upper surface of an insulating substrate 11 and a metal layer 13A, which is electrically connected to first substrate wiring layer 12 by substrate shorting parts 14, is formed on the lower surface of insulating substrate 11.

The core wiring substrate member 10A may be manufactured for example as follows. That is, as shown in FIG. 5, a laminated material 10B, with which a metal layer 13A is formed on the lower surface of an insulating substrate 11, is prepared, and as shown in FIG. 6, through holes 14H, which pass through the insulating substrate 11 in the thickness direction in correspondence to the substrate shorting parts to be formed, are formed on insulating substrate 11 of laminated material 10B. Electrodeposition is then performed on the laminating material 10B using metal layer 13A as the deposition cathode electrode in the above-described electrodeposition solution to deposit the conductive microparticles and organic particles in the electrodeposition solution and thereby form a deposit on the surface of metal layer 13A in the interiors of through holes 14H. By then performing heating treatment of the deposit as necessary, substrate shorting parts 14, which extend through the insulating substrate 11 in its thickness direction, are formed as shown in FIG. 7. By then performing polishing of the upper surface of insulating substrate 11 as necessary and thereafter forming first substrate wiring layer 12 on the upper surface of insulating substrate 11, the core wiring substrate member 10A shown in FIG. 4 is obtained.

In the above, the method of illuminating laser light is favorably used as the method of forming the through holes 14H in insulating substrate 11 since through holes 14H of small diameter can thereby be obtained.

The constant voltage method is preferably used as the electrodeposition method since the thickness can then be controlled readily. The specific conditions for electrodeposition are set appropriately in consideration of the materials, concentrations and the like of the conductive microparticles and organic particles contained in the electrodeposition solution and, for example, are an applied voltage of 50 to 500V and a treatment time of 0.5 to 200 minutes.

In the case where the deposit formed by electrodeposition is to be heat treated, the conditions of the heat treatment are set appropriately in consideration of the materials and the like of the organic particles contained in the electrodeposition solution and, for example, the heating temperature is preferably 100 to 400° C. and more preferably 150 to 300° C. and the heating duration is preferably 5 minutes or more and more preferably 10 minutes or more.

A wiring layer forming method that is used in the manufacture of prior-art printed wiring boards may be used as the method of forming first substrate wiring layer 12. For example, the subtractive method, in which electroless deposition or electrolytic copper plating is applied on the entire upper surface of insulating substrate 11 to form a metal layer and a part of the metal layer is then removed by photoetching to form the wiring layer, the additive method, in which a wiring layer comprised of a patterned metal layer is directly formed by performing photolithography or electroless deposition on the upper surface of insulating substrate 11, and other methods may be used.

As shown in FIG. 8, an upper insulating layer 20, in which are formed through holes 22H corresponding to the interlayer shorting parts 22 that are to be formed, is formed on the upper surface of such a core wiring substrate member 10A. Next, electrodeposition in an above-described electrodeposition solution is performed using first substrate wiring layer 12 as the deposition cathode electrode to cause the conductive microparticles and the organic particles in the electrodeposition solution to deposit and deposits are thereby formed on the surfaces of first substrate wiring layer 12 inside through holes 22H. By then performing heat treatment of these deposits as necessary, interlayer shorting parts 22, which extend through upper insulating layer 20 in its thickness direction, are formed as shown in FIG. 9.

As the method of forming the upper insulating layer 20, having through holes 22H formed therein, for the above process, the method of coating a liquid radiation-curing resin material onto the upper surface of core wiring substrate member 10A and then performing exposure treatment and development treatment on the coated film to form upper insulating layer 20, in which through holes 22H are formed, the method of coating a liquid thermosetting resin material onto or setting a sheet-like thermosetting resin material on the surface of core wiring substrate 10A, then performing heat treatment to form upper insulating layer 20, and then illuminating upper insulating layer 20 with laser to form through holes 22H may be used.

The method and specific conditions for electrodeposition are the same as those for the above-described formation of substrate shorting parts 14.

After thus forming upper insulating layer 20 and interlayer shorting parts 22 and performing polishing treatment of the surface of upper insulating layer 20 as necessary, electroless deposition or electroplating is applied to the upper surface of upper insulating layer 20 to form a metal layer 21A as shown in FIG. 10.

Photoetching is then performed on the metal layer 13A on core wiring substrate member 10A and a part of the metal layer 13A is thereby eliminated to form a second substrate wiring layer 13 on the lower surface of insulating substrate 10. Core wiring substrate 10 is thus formed.

Then as shown in FIG. 12, a lower insulating layer 30, in which are formed through holes 32H corresponding to the interlayer shorting parts 32 that are to be formed, is formed on the lower surface of core wiring substrate 10. Next, electrodeposition in an above-described electrodeposition solution is performed using second substrate wiring layer 13 as the deposition cathode electrode to cause the conductive microparticles and the organic particles in the electrodeposition solution to deposit and deposits are thereby formed on the surfaces of second substrate wiring layer 13 inside through holes 32H. By then performing heat treatment of these deposits as necessary, interlayer shorting parts 22, which extend through upper insulating layer 20 in its thickness direction, are formed as shown in FIG. 13.

For the above, the method of forming the lower insulating layer 30, in which through holes 32H are formed, and the method and specific conditions of electrodeposition are the same as those described above for the formation of lower insulating layer 20 and interlayer shorting parts 22.

Photoetching is then performed on the metal layer 21A formed on the surface of upper insulating layer 20 and a part of the metal layer 21A is thereby eliminated to form an upper wiring layer 21 and a lower wiring layer 31 is formed on the lower surface of lower insulating layer 30 upon performing polishing treatment on the lower surface of the lower insulating layer 30 as necessary.

As the above-described method for forming the first substrate wiring layer 12, a wire layer forming method used in the manufacture of prior-art printed wiring boards may be used as a method of forming the lower wiring layer 31, and in the case where the subtractive method is to be used, the photoetching treatment may be carried out by the same process as that of the photoetching treatment of metal layer 21A in the forming of upper wiring layer 21.

By then forming solder resist layers 25 and 35, having openings 26 and 36 that expose the lands for connection of parts on upper wiring layer 21 and lower wiring layer 31, on the upper surface of upper insulating layer 20, including the upper wiring layer 21, and the lower surface of lower insulating layer 30, including the lower wiring layer 31, respectively, a multilayer wiring board of the arrangement shown in FIG. 3 can be obtained.

With such a multilayer wiring board, since interlayer shorting parts 22 and 32 can be formed in a short time by electrodeposition using substrate wiring layers 12 and 13 as deposition cathode electrodes in an electrodeposition solution in which conductive microparticles and organic particles are dispersed, high productivity is achieved in the manufacture of the multilayer wiring board.

Also, an electrodeposition solution of low viscosity can be prepared readily, and by using such an electrodeposition solution, the electrodeposition solution can be made to enter adequately into through holes 21H and 31H, formed in upper insulating layer 20 and lower insulating layer 30, respectively, even when the diameters of through holes 21H and 31H are small. As a result, the desired interlayer shorting parts 22 and 32 can be formed without fail and a high connection reliability can be obtained.

Since an aqueous dispersion forming conductive layer of the invention enables the formation of a conductive layer by electrodeposition, a conductive layer of high precision in terms of film thickness, position and the like can be formed readily in comparison to prior arts based on coating, printing and the like. Also, since a film is formed not by plating but by electrodeposition of microparticles, the rate of growth of the film is high and the productivity is good. In the case using the aqueous dispersion, since organic particles, which are resin components, are electrodeposited along with conductive microparticles, a conductive layer that excels in adhesive property to the substrate can be obtained. Since the resin component is dispersed as particles in an aqueous medium in the invention, unlike the case where a resin component is used in an organic solvent solution or in a non-solvent condition, the viscosity of the dispersive solution is little affected by the concentration and molecular weight of the resin component and the dispersive solution can thus be made one with a viscosity that is suitable for electrodeposition.

A conductive layer of the invention, which is formed using an above-described aqueous dispersion, is, as has been mentioned above, excellent in adhesive property to the substrate and can be made high in film thickness precision, positional precision or the like. By making use of these characteristics, a conductive layer of the invention can be applied favorably to conductive circuits, bumps, circuit boards that combine such components, and other electronic parts.

According to a circuit board manufacturing method of the invention. a circuit board, which is formed from an aqueous dispersion of the invention and is equipped with a conductive layer that includes conducting through parts that pass through the insulating layer, can be manufactured efficiently.

According to the multilayer wiring board of the invention, since interlayer shorting parts are formed in a short time by electrodeposition using a substrate wiring layer as the deposition electrode in an electrodeposition solution in which conductive microparticles and organic particles are dispersed, high productivity can be achieved in the manufacture of the multilayer wiring board.

Also, an electrodeposition solution of low viscosity can be prepared readily, and by using such an electrodeposition solution, the electrodeposition solution can be made to enter adequately into through holes that are formed in an insulating layer even when the diameters of the through holes are small. As a result, the desired interlayer shorting parts can be formed inout fail and a high connection reliability can be obtained.

According to a multilayer wiring board manufacturing method of the invention, since interlayer shorting parts are formed in a short time by electrodeposition using a substrate wiring layer as the deposition electrode in an electrodeposition solution in which conductive microparticles and organic particles are dispersed, high productivity can be achieved.

Also, an electrodeposition solution of low viscosity can be prepared readily, and by using such an electrodeposition solution, the electrodeposition solution can be made to enter adequately into through holes that are formed in an insulating layer even when the diameters of the through holes are small. As a result, the desired interlayer shorting parts can be formed inout fail and a multilayer wiring board of high connection reliability can be manufactured.

BRIEF DESCRIPTION OF THE DRAWINGS

FIG. 14 is an explanatory sectional view, which shows the condition where an upper wiring layer has been formed on the surface of the upper insulating layer and a lower wiring layer has been formed on the lower surface of the lower insulating layer.

PREFERRED EMBODIMENTS OF THE INVENTION

Figure 1:
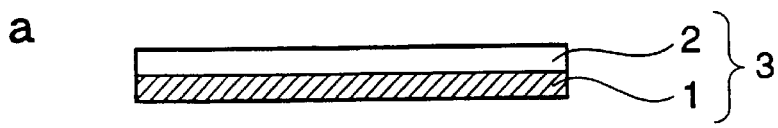
FIGS. 1(a) through (e) are schematic sectional views, which show the process of manufacturing a circuit board using Method 1.
Figure 1:
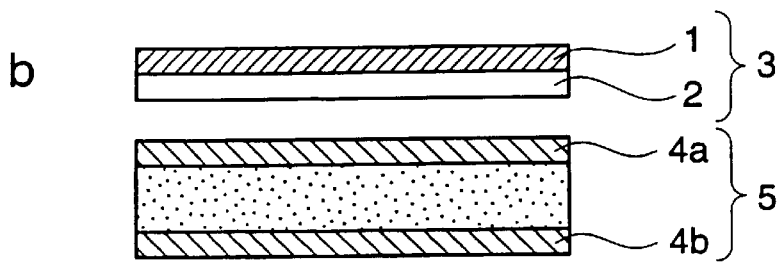
Figure 1:
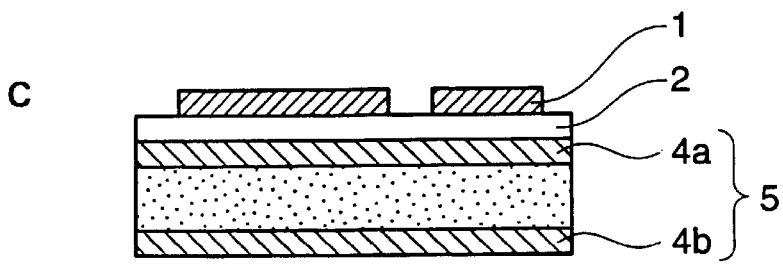
Figure 1:
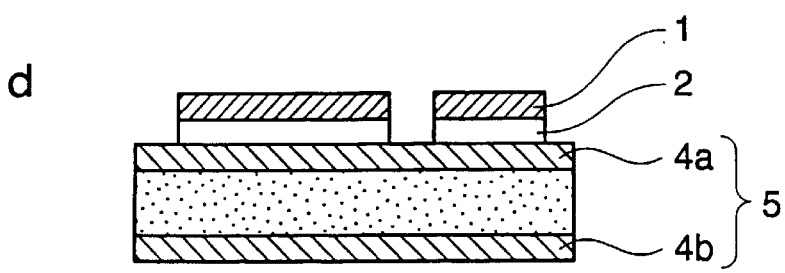
Figure 1:
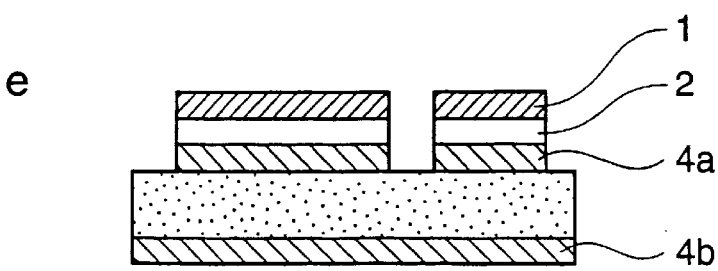

The invention shall now be explained in more detail by way of examples and comparative examples. Unless otherwise noted, the "parts" and "%" in the following description are based on weight.

[1]Preparation of Conductive Microparticle Dispersive Solution

SYNTHESIS EXAMPLE 1

Copper Microparticle Dispersive Solution a 20 parts of copper microparticles, produced by the gas phase vaporization method (made by Vacuum Metallurgical Co., Ltd.; number-average primary particle diameter: 0.050 $\mu$m), and 80 parts of isopropyl alcohol were mixed using a homomixer. 0.6 parts of diethanolamine were then added and ultrasonic dispersion was performed for 10 minutes, thereby obtaining an alcohol dispersive solution of copper particles (solids concentration: 20%) inout any aggregates.

SYNTHESIS EXAMPLE 2

Copper Microparticle Dispersive Solution b 20 parts of copper microparticles, produced by the reduction method (made by Sumitomo Metal Industries Ltd.; number-average primary particle diameter: 0.3 $\mu$m), and 20 parts of isopropyl alcohol were mixed using a homomixer. 1 part of monoethanolamine and 30 parts of isopropyl alcohol were then added and the mixture was subject to a high-pressure homogenizer (made by Hakusui Tech Co., Ltd.), thereby obtaining an alcohol dispersive solution of copper particles (solids concentration: 20%) inout any aggregates.

SYNTHESIS EXAMPLE 3

Copper Microparticle Dispersive Solution c 20 parts of copper microparticles, produced by the electrolysis method (made by Kawatetsu Kogyo Co., Ltd.; number-average primary particle diameter: 0.5 $\mu$m), and 30 parts of isopropyl alcohol were mixed using a homomixer. 50 parts of isopropyl alcohol were then added and the mixture was subject to a high-pressure homogenizer (made by Hakusui Tech Co., Ltd.), thereby obtaining an alcohol dispersive solution of copper particles (solids concentration: 20%) inout any aggregates.

SYNTHESIS EXAMPLE 4

Nickel Microparticle Dispersive Solution 10 parts of nickel microparticles, produced by the gas phase vaporization method (made by Vacuum Metallurgical Co., Ltd.; number-average primary particle diameter: 0.020 μm), and 90 parts of isopropyl alcohol were mixed using a homomixer. 0.3 parts of diethanolamine were then added and ultrasonic dispersion was performed for 10 minutes, thereby obtaining an alcohol dispersive solution of nickel particles (solids concentration: 10%) inout any aggregates.

SYNTHESIS EXAMPLE 5

Silver Microparticle Dispersive Solution 20 parts of silver microparticles, produced by the gas phase vaporization method (made by Vacuum Metallurgical Co., Ltd.; number-average primary particle diameter: 0.050 μm), and 80 parts of ethyl alcohol were mixed using a homomixer. 0.3 parts of diethanolamine were then added and ultrasonic dispersion was performed for 10 minutes, thereby obtaining an alcohol dispersive solution of silver particles (solids concentration: 20%) inout any aggregates.

[2]Preparation of Organic Particle Emulsion

SYNTHESIS EXAMPLE 6

Acrylic-based Resin Emulsion 100 parts of isopropyl alcohol were loaded into a reactor and heated to 80° C. 85 parts of ethyl acrylate, 10 parts of methacrylic acid, 5 parts of glycidyl methacrylate and 1 part of azoisobutyronitrile were mixed in a separate container and then dripped continuously into the reactor over a duration of 5 hours to obtain an alcohol solution of acrylic resin. 20 parts of the acrylic resin solution (10 parts as solids) and 0.2 parts of monoethanolamine were added while stirring strongly to 90 parts of ion-exchanged water, thereby obtaining an emulsion of anionic organic particles, having an acrylic-based resin polymer as the principal component.

SYNTHESIS EXAMPLE 7

Epoxy-based Resin Emulsion A 40 parts of a block isocyanate, comprised of tolylene diisocyanate and 2-ethylhexanol, and 60 parts of an epoxy polycarboxylic acid adduct, obtained by reacting Epicoat 828 (made by Yuka Shell Epoxy Inc.) and polycarboxylic acid (made by Johnson Polymer), were mixed and 3 parts of monoethanolamine were added as a pH adjuster. The mixture was then loaded while stirring into 400 parts of ion-exchanged water, thereby obtaining an emulsion of anionic organic particles, having an epoxy-based resin precursor as the principal component.

SYNTHESIS EXAMPLE 8

Epoxy-based Resin Emulsion B 35 parts of a block isocyanate, comprised of tolylene diisocyanate and 2-ethylhexanol, and 65 parts of an epoxy amine adduct, obtained by reacting Epicoat 828 (made by Yuka Shell Epoxy Inc.) and diethylamine, were mixed and 2.5 parts of acetic acid were added as a pH adjuster. The mixture was then loaded while stirring into 400 parts of ion-exchanged water, thereby obtaining an emulsion of cationic organic particles, having an epoxy-based resin precursor as the principal component.

SYNTHESIS EXAMPLE 9

Polyimide-based Resin Emulsion

As tetracarboxylic dianhydrides, 32.29 g (90 millimoles) of 3,3',4,4'-biphenylsulfonetetracarboxylic dianhydride and 3.00 g (10 millimoles) of 1,3,3a,4,5,9b-hexahydro-5-(tetrahydro-2,5-dioxo-3-furanyl)-naphtho[1,2-c]-furan-1,3-dione, and, as diamine compounds, 36.95 g (90 millimoles) of 2,2-bis[4-(4-aminophenoxy)phenyl]propane and 2.49 g (10 millimoles) of organosiloxane (made by Shinetsu Chemicals Inc.; trade name: "LP7100") were dissolved in 450 g of N-methyl-2-pyrrolidone and reacted at room temperature for 12 hours. Thereafter, 32 g of pyridine and 71 g of acetic anhydride were added to the reaction solution and a dehydration ring-closing reaction was carried out for 3 hours at 100° C. The reaction solution was then refined by distillation under reduced pressure, thereby obtaining a polyimide solution in a solids content of 10%.

A reactor, in which 100 parts of y-butyrolactone were placed, was kept at 85° C. under a nitrogen gas atmosphere, and while continuously adding a mixed solution, comprised of 65 parts of n-butyl acrylate, 30 parts of dimethylaminoethyl acrylate, 5 parts of glycidyl methacrylate, and 1 part of azobisisobutyronitrile, into the reactor over a duration of 5 hours, solution polymerization was carried out while stirring. After the completion of dripping, further stirring was continued at 85° C. for 2 hours to complete the solution polymerization, thereby obtaining an acrylic polymer solution in a solids content of 50%.

50 parts (as solids) of the polyimide solution and 30 parts (as solids) of the acrylic polymer solution were mixed in 20 parts of Epicoat 828 (trade name of product made by Yuka Shell Epoxy Inc.), and after letting the mixture react for 3 hours at 70° C., 3 parts of acetic acid were added and mixed gradually to adjust the pH- 1000 parts of distilled water were then added gradually while stirring strongly, thereby obtaining an emulsion of cationic organic particles having a polyimide-based resin as the principal component.

[3]Preparation of Aqueous Dispersion

EXAMPLE 1

500 parts (100 parts as solids) of the copper microparticle dispersive solution a, obtained in Synthesis Example 1, and 100 parts (10 parts as solids) of the acrylic-based resin emulsion, obtained in Synthesis Example 6, were mixed to prepare an aqueous dispersion. The volume ratio of the copper microparticles to the acrylic-based resin contained in the aqueous dispersion was 53/47, and the water content as measured with the Karl Fischer method was 13% by weight.

EXAMPLE 2

500 parts (100 parts as solids) of the copper microparticle dispersive solution b, obtained in Synthesis Example 2, and 100 parts (10 parts as solids) of the acrylic-based resin emulsion, obtained in Synthesis Example 6, were mixed to prepare an aqueous dispersion. The volume ratio of the copper microparticles to the acrylic-based resin contained in the aqueous dispersion was 53/47, and the water content as measured with the Karl Fischer method was 13% by weight.

EXAMPLE 3

1000 parts (100 parts as solids) of the nickel microparticle dispersive solution, obtained in Synthesis Example 4, and 100 parts (10 parts as solids) of the acrylic-based resin emulsion, obtained in Synthesis Example 6, were mixed to prepare an aqueous dispersion. The volume ratio of the nickel microparticles to the acrylic-based resin contained in the aqueous dispersion was 53/47, and the water content as measured with the Karl Fischer method was 7% by weight.

EXAMPLE 4

500 parts (100 parts as solids) of the silver microparticle dispersive solution, obtained in Synthesis Example 5, and 100 parts (10 parts as solids) of the acrylic-based resin emulsion, obtained in Synthesis Example 6, were mixed to prepare an aqueous dispersion. The volume ratio of the silver microparticles to the acrylic-based resin contained in the aqueous dispersion was 49/51, and the water content as measured with the Karl Fischer method was 13% by weight.

EXAMPLE 5

500 parts (100 parts as solids) of the silver microparticle dispersive solution, obtained in Synthesis Example 5, and 50 parts (10 parts as solids) of the epoxy-based resin emulsion A, obtained in Synthesis Example 7, were mixed to prepare an aqueous dispersion. The volume ratio of the silver microparticles to the epoxy-based resin contained in the aqueous dispersion was 49/51, and the water content as measured with the Karl Fischer method was 7% by weight.

EXAMPLE 6

500 parts (100 parts as solids) of the copper microparticle dispersive solution a, obtained in Synthesis Example 1, and 100 parts (10 parts as solids) of the epoxy-based resin emulsion B, obtained in Synthesis Example 8, were mixed to prepare an aqueous dispersion. The volume ratio of the copper microparticles to the epoxy-based resin contained in the aqueous dispersion was 53/47, and the water content as measured with the Karl Fischer method was 6.5% by weight.

EXAMPLE 7

500 parts (100 parts as solids) of the copper microparticle dispersive solution c, obtained in Synthesis Example 3, and 30.1 parts (2.0 parts as solids) of the polyimide-based resin emulsion, obtained in Synthesis Example 9, were mixed to prepare an aqueous dispersion. The volume ratio of the copper microparticles to the polyimide-based resin contained in the aqueous dispersion was 85/15, and the water content as measured with the Karl Fischer method was 3.7% by weight.

EXAMPLE 8

1000 parts (100 parts as solids) of the nickel microparticle dispersive solution, obtained in Synthesis Example 1, and 100 parts (10 parts as solids) of the epoxy-based resin emulsion B, obtained in Synthesis Example 8, were mixed to prepare an aqueous dispersion. The volume ratio of the nickel microparticles to the epoxy-based resin contained in the aqueous dispersion was 53/47, and the water content as measured with the Karl Fischer method was 3.5% by weight.

EXAMPLE 9

500 parts (100 parts as solids) of the silver microparticle dispersive solution, obtained in Synthesis Example 5, and 100 parts (6.5 parts as solids) of the polyimide-based resin emulsion, obtained in Synthesis Example 9, were mixed to prepare an aqueous dispersion. The volume ratio of the silver microparticles to the polyimide-based resin contained in the aqueous dispersion was 59/41, and the water content as measured with the Karl Fischer method was 11% by weight.

COMPARATIVE EXAMPLE 1

In place of the 100 parts of the acrylic-based resin emulsion used in Example 1, 100 parts of ion-exchanged water were added to 500 parts (100 parts as solids) of the copper microparticle dispersive solution a, obtained in Synthesis Example 1, to prepare an aqueous dispersion.

COMPARATIVE EXAMPLE 2

500 parts (100 parts as solids) of the alcohol dispersive solution a of copper microparticles, obtained in Synthesis Example 1, were used directly (that is, inout addition of an aqueous dispersion).

COMPARATIVE EXAMPLE 3

In place of the 100 parts of the epoxy-based resin emulsion used in Example 6, 500 parts of ion-exchanged water were added to 500 parts (100 parts as solids) of the copper microparticle dispersive solution a, obtained in Synthesis Example 1, to prepare an aqueous dispersion.

[4]Formation and Performance Evaluation of Conductive Layers

[4-1]Electrodeposition Onto Anode

Into each of the above-described dispersive solutions of Examples 1 through 5 and Comparative Examples 1 and 2, a copper sputtered silicon wafer was placed as the anode and an SUS plate was placed as the counter electrode (cathode). Particles were then electrodeposited onto the anode with the constant voltage method at 70V (electrodeposition time: 2 minutes). Thereafter, heating at 100° C. was performed for 10 minutes and further heating at 250° C. in a nitrogen atmosphere, in 3% hydrogen mixed in, was performed for 1 hour, thereby obtaining a conductive layer of 15 µm thickness. In the aqueous dispersion of Comparative Example 1, a film could not be obtained due to poor film forming property. Also in the alcohol dispersive solution of Comparative Example 2, a film was not formed even when voltage was applied.

The preservation stability of each of the dispersive solutions of Examples 1 through 5 and Comparative Examples 1 and 2 was evaluated by the method described below. Also, the performance of each of the conductive layers obtained by electrodeposition was evaluated by the methods described below. The evaluation results are shown in Tables 1 and 2.

Preservation Stability

A dispersive solution was placed in a plastic bottle and the dispersion condition and viscosity after 10 days of storage at 20° C. were observed visually. The evaluation results are indicated in the following two stages.

○: There is no change in viscosity and the dispersion condition is good.

×: The dispersion separated into two layers.

Volume Resistivity

The volume resistivity was measured in compliance to JIS K6481.

Adhesive Property

Peeling tests using cellophane adhesive tape were performed and the peeling of the conductive layer was evaluated in the following two stages.

○: No changes whatsoever.

Δ: Slight changes were observed.

×: Peeling was observed.

could not be achieved. Also, the dispersive solutions of Comparative Examples 1 and 2 were both poor in storage stability.

[4-2]Electrodeposition Onto Cathode

Into each of the above-described dispersive solutions of Examples 6 through 9 and Comparative Examples 2 and 3, a copper sputtered silicon wafer was placed as the cathode and an SUS plate was placed as the counter electrode (anode). Particles were then electrodeposited onto the cathode by the constant voltage method at 200V (electrodeposition time: 2 minutes). Thereafter, heating at 100° C. was performed for 10 minutes and further heating at

TABLE 1

|  |  | Example 1 | Example 2 | Example 3 |
|---|---|---|---|---|
| Conductive particles | Particle material | Copper | Copper | Nickel |
|  | Volume resistivity[1] | 0.017 | 0.017 | 0.070 |
|  | Primary particle diameter ($\mu$m) | 0.05 | 0.30 | 0.02 |
|  | Parts (solids) | 100 | 100 | 100 |
| Organic particles | Particle material | Acrylic | Acrylic | Acrylic |
|  | Functional group | Carboxylic group | Carboxylic group | Carboxylic group |
|  | Parts (solids) | 10 | 10 | 10 |
| Aqueous dispersion | Volume ratio[2] | 53/47 | 53/47 | 53/47 |
|  | pH | 9.0 | 9.2 | 8.9 |
|  | Viscosity (mPa · s) | 10 | 10 | 10 |
|  | Water content (%) | 13 | 13 | 7 |
|  | Solids concentration (%) | 18 | 18 | 18 |
|  | Preservation stability | ○ | ○ | ○ |
| Conductive layer | Film thickness ($\mu$m) | 15 | 16 | 15 |
|  | Volume resistivity[1] | 1.2 | 0.08 | 0.9 |
|  | Adhesive property | ○ | ○ | ○ |

[1]The unit of volume resistivity is ($10^{-4}\Omega$ · cm).
[2]The volume ratio is expressed as conductive particles/organic particles.

TABLE 2

|  |  | Example 4 | Example 5 | Comparative Example 1 | Comparative Example 2 |
|---|---|---|---|---|---|
| Conductive particles | Particle material | Silver | Silver | Copper | Copper |
|  | Volume resistivity[1] | 0.016 | 0.016 | 0.017 | 0.017 |
|  | Primary particle diameter ($\mu$m) | 0.07 | 0.07 | 0.05 | 0.05 |
|  | Parts (solids) | 100 | 100 | 100 | 100 |
| Organic particles | Particle material | Acrylic | Epoxy | — | — |
|  | Functional group | Carboxylic group | Carboxylic group | — | — |
|  | Parts (solids) | 10 | 10 | — | — |
| Aqueous dispersion | Volume ratio[2] | 49/51 | 49/51 | 100/0 | 100/0 |
|  | pH | 9.0 | 9.2 | 90 | — |
|  | Viscosity (mPa · s) | 10 | 10 | 10 | 7 |
|  | Water content (%) | 13 | 7 | 17 | 1 |
|  | Solids concentration (%) | 18 | 18 | 17 | 20 |
|  | Preservation stability | ○ | ○ | x | x |
| Conductive layer | Film thickness ($\mu$m) | 15 | 15 | — | — |
|  | Volume resistivity[1] | 0.1 | 0.2 | — | — |
|  | Adhesive property | ○ | ○ | — | — |

[1]The unit of volume resistivity is ($10^{-4}\Omega$ · cm).
[2]The volume ratio is expressed as conductive particles/organic particles.

As is clear from Tables 1 and 2, all of the aqueous dispersive solutions of Examples 1 through 5 were excellent in preservation stability and the conductive layers formed by electrodeposition in these aqueous dispersions were low in volume resistivity and good in adhesive property to the substrate.

Meanwhile, in Comparative Example 1, which is of an aqueous dispersion that does not contain organic particles, the film forming property was inadequate, and in Comparative Example 2, which is of an alcohol dispersive solution that does not contain organic particles, electrodeposition 250° C. in a nitrogen atmosphere, in 3% hydrogen mixed in, was performed for 1 hour, thereby obtaining a conductive layer of 15 $\mu$m thickness. In the aqueous dispersions of Comparative Examples 2 and 3, a film did not form even upon electrodeposition.

The preservation stability of each of the dispersive solutions of Examples 6 through 9 and Comparative Examples 2 and 3 was evaluated by the method described above. Also, the performance of each of the conductive layers obtained by electrodeposition was evaluated by the methods described above. The evaluation results are shown in Tables 3 and 4.

TABLE 3

| | | Example 6 | Example 7 | Example 8 |
|---|---|---|---|---|
| Conductive particles | Particle material | Copper | Copper | Nickel |
| | Primary particle diameter ($\mu$m) | 0.05 | 0.5 | 0.02 |
| | Parts (solids) | 100 | 100 | 100 |
| Organic particles | Particle material | Epoxy | Polyimide | Epoxy |
| | Parts (solids) | 10 | 10 | 10 |
| Aqueous dispersion | Volume ratio (conductive particles/organic particles) | 53/47 | 85/15 | 53/47 |
| | pH | 9.0 | 5.5 | 8.9 |
| | Viscosity (mPa · s) | 10 | 10 | 10 |
| | Water content (%) | 6.5 | 11 | 3.5 |
| | Solids concentration (%) | 18 | 18 | 18 |
| | Preservation stability | ○ | ○ | ○ |
| Conductive layer | Film thickness ($\mu$m) | 15 | 16 | 15 |
| | Volume resistivity ($10^{-4}\Omega$ · cm) | 0.1 | 0.1 | 0.2 |
| | Adhesive property | ○ | ○ | ○ |

TABLE 4

| | | Example 9 | Comparative Example 2 | Comparative Example 3 |
|---|---|---|---|---|
| Conductive particles | Particle material | Silver | Copper | Copper |
| | Primary particle diameter ($\mu$m) | 0.07 | 0.05 | 0.05 |
| | Parts (solids) | 100 | 100 | 100 |
| Organic particles | Particle material | Polyimide | — | — |
| | Parts (solids) | 6.5 | — | — |
| Aqueous dispersion | Volume ratio (conductive particles/organic particles) | 59/41 | 100/0 | 100/0 |
| | pH | 9.0 | — | 9.0 |
| | Viscosity (mPa · s) | 10 | 7 | 10 |
| | Water content (%) | 11 | 1 | 56 |
| | Solids concentration (%) | 18 | 20 | 17 |
| | Preservation stability | ○ | x | ○ |
| Conductive layer | Film thickness ($\mu$m) | 15 | Film could not be formed. | Film could not be formed. |
| | Volume resistivity ($10^{-4}\Omega$ · cm) | 0.05 | — | — |
| | Adhesive property | ○ | — | — |

As is clear from Tables 3 and 4, all of the aqueous dispersive solutions of Examples 6 through 9 were excellent in preservation stability and the conductive layers formed by electrodeposition in these aqueous dispersions were good in electrical characteristics and adhesive property. Meanwhile, the aqueous dispersions of Comparative Examples 2 and 3, which did not contain organic particles, did not have film forming properties and the dispersion of Comparative Example 2 was poor in storage stability.

[5]Manufacture and Performance Evaluation of Circuit Boards

Circuit boards were manufactured using the prepared aqueous dispersions and were evaluated in terms of performance.

EXAMPLE 10

Manufacture of Circuit Board by Method 1

A substrate of 100 $\mu$m thickness, prepared by impregnating BT Resin (trade name of product made by Mitsubishi Gas Chemicals Inc.) in glass fiber and semi-curing the resin, was used as a core insulating layer 41. Through holes 411 of 80 $\mu$m diameter were formed by carbon dioxide gas laser processing at prescribed positions of the core insulating layer 41 [FIG. 1(a)]. Next, a conductive foil 42, comprised of a copper foil of 18 $\mu$m thickness, was adhered by heat pressing onto one of the surfaces of core insulating layer 41 [FIG. 1(b)].

The core insulating layer 41 in conductive foil 42 was then immersed in the dispersion of Example 6, and using the conductive foil 42 as the cathode and the counter electrode as the anode, electrodeposition was performed while stirring at a temperature of 20° C. for 2 minutes at a voltage of 200V and a distance between electrodes of 15 cm. The epoxy-based resin that was electrodeposited onto the interiors of through holes 411 was then pre-dried at 100° C. for 15 minutes, thereby forming conducting through parts 421 [FIG. 1(c)].

A conductive foil was positioned and laminated onto the semi-cured substrate in conductive foil, and the substrate was cured completely by heating by a vacuum heat press for 1 hour at 200° C. in a nitrogen atmosphere, having 3% hydrogen mixed in, thereby obtaining a substrate in which the interlayer circuits are connected by conducting through parts 421 [FIG. 1(d)]. After then forming a pattern using a dry film resist on conductive foil 42, etching was performed by immersion in a ferric chloride etching solution, thereby obtaining a cured substrate in a circuit [FIG. 1(e)].

EXAMPLE 11

Manufacture of Circuit Board by Method 2

Figure 2:
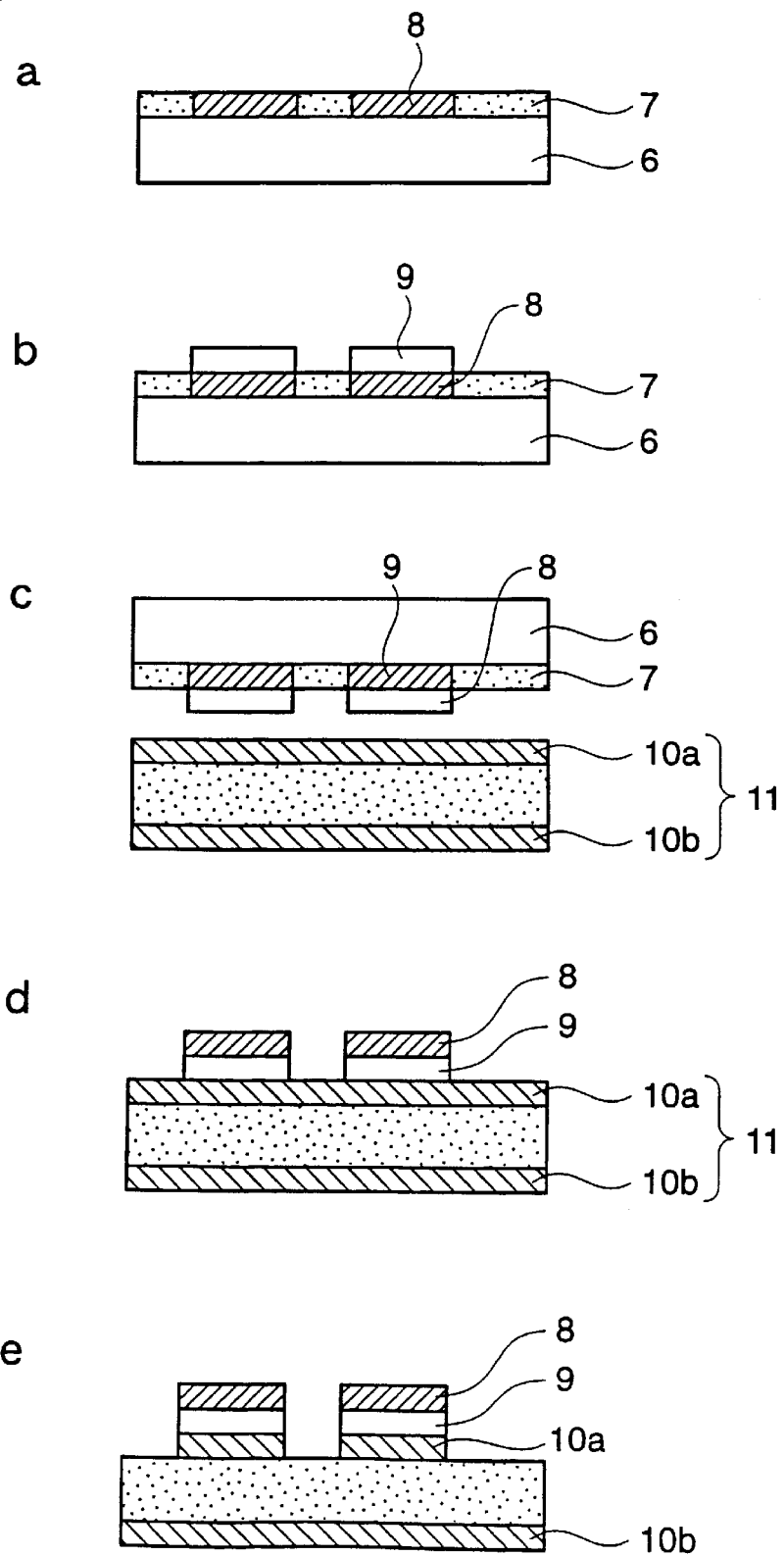
FIGS. 2(a) through (e) are schematic sectional views, which show the process of manufacturing a circuit board using Method 2.
Figure 3:
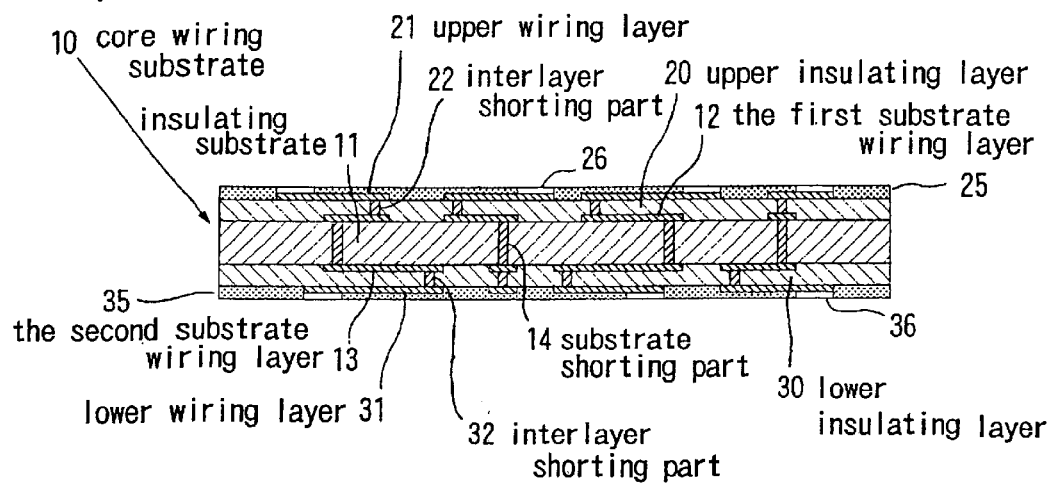
FIG. 3 is an explanatory sectional view, which shows the arrangement of an example of a multilayer wiring board of the invention.

Using the substrate, on which a circuit was manufactured in Example 10, as the core wiring substrate 48 [FIG. 2(a)], a photosensitive epoxy resin was coated to a thickness of 100 $\mu$m onto both surfaces of core wiring substrate 48 to form insulating layers 45 [FIG. 2(b)]. Thereafter, through holes 451 of 80 μm diameter were formed in a patterned manner in insulating layers 45, thereby forming insulating layer patterns 46 [FIG. 2(c)]. After then performing electroless deposition on the insulating layer patterns 46 [FIG. 2(d)], the substrate was immersed in the dispersion of Example 7, and using electroless plated layers 47 as the cathode and the counter electrode as the anode, electrodeposition was performed while stirring at 20° C., a distance between electrodes of 15 cm, and a voltage of 200V. The electrodeposited polyimide-based resin was then pre-dried for 15 minutes at 100° C., thereby forming conductive layers 43 over the entire surfaces of electroless plated layers 47 [FIG. 2(e)]. Parts of these conductive layers 43 are conducting through parts 432 formed in the interiors of through holes 451. Further heating for 1 hour at 230° C. under a nitrogen atmosphere, having 3% hydrogen mixed in, was then performed in a heat drying oven to completely cure the conducting layers, thereby obtaining a circuit board, in which interlayer circuits are joined by conducting through parts 432.

EXAMPLE 12

In forming the conducting through parts 421 of Example 10, electrodeposition was performed using the dispersive solution of Example 7 and pre-drying was performed for 15 minutes at 100° C. The substrate was thereafter immersed in a copper electroplating solution (trade name: "Microfab Cu 200"; made by Nihon Electroplating Inc.) and using conductive foil 42 as the cathode, electrodeposition was performed for 5 minutes at a voltage of IV and a conduction time during 1 cycle of 100 ms (0V for 500 ms). Otherwise, a cured substrate in circuit was obtained in the same manner as in Example 10.

COMPARATIVE EXAMPLE 4

Unlike Example 10, in which conducting through parts 421 in the interiors of through holes 411 were formed by electrodeposition, a copper-based conductive paste (viscosity: 100 Pa·s) were filled into through holes 411 via a metal plate (thickness: 100 μm; hole diameter: 90 μm) and by means of a screen printer. Otherwise, the circuit board of Comparative Example 4 was obtained in the same manner as in Example 10.

The circuit boards that were obtained were evaluated as described below. The results are shown in table 5

Resistivity of Insulating Layer

The resistivity of the insulating layer was measured in compliance to JIS K6911.

Resistivity of Conducting Through Parts

The volume resistivity was determined by measuring the resistivity across the upper and lower layers.

Connection Reliability Test of Conducting Through Parts

The cycle of leaving a circuit board for 30 minutes at −55° C. and then for 30 minutes at 125° C. was repeated 500 times and the change of the electrical resistance was examined in a circuit to which 500 bumps were connected. The test result was indicated as passing (○) if the electrical resistance was less than 250 mΩ and as failing (×) if the electrical resistance was 250 mΩ or more.

Solder Dipping Test

The electrical resistance was examined in a circuit to which 500 bumps were connected before and after immersion of the circuit board for 10 seconds in a bath of molten solder heated at 260° C. In regard to the test results, since if the electrical resistance is less than 250 mΩ, the resistance per bump will be less than 0.5 mΩ, the condition was regarded as passing (○) and if the electrical resistance was 250 mΩ or more, the condition was regarded as failing (×).

TABLE 5

|  | Example 10 | Example 11 | Example 12 | Comparative Example 4 |
|---|---|---|---|---|
| Forming material of conducting through parts | Dispersive solution of Example 6 | Dispersive solution of Example 7 | Dispersive solution of Example 7 | Commercially sold conductive past |
| Circuit board manufacturing method | Method 1 (electrodeposition) | Method 2 (electrodeposition) | Method 1 (electrodeposition) | Printing |
| Resistivity of conducting through parts (mΩ · cm) | 0.2 | 0.3 | 0.1 | 10 |
| Connection reliability of conducting through parts |  |  |  |  |
| Temperature cycle test | ○ | ○ | ○ | x |
| Solder dipping test | ○ | ○ | ○ | x |

As can be understood from Table 5, in the circuit boards equipped in the conductive layer formed from an aqueous dispersion of the invention, the interlayer circuits were connected at a low resistivity by the conducting through parts and the connection reliability was also excellent. On the other hand, in Comparative Example 4, in which conducting through parts were formed by the printing method using a prior-art conductive paste, since the interiors of the through holes of 80 μm diameter could not be filled inout fail by the highly viscous conductive paste, the resistivity of the conducting through parts was high and the connection reliability was inadequate.

[6] Manufacture and Performance Evaluation of Multilayer Wiring Boards

EXAMPLE 13

(1) Preparation of Core Wiring Substrate Member

Figure 5:
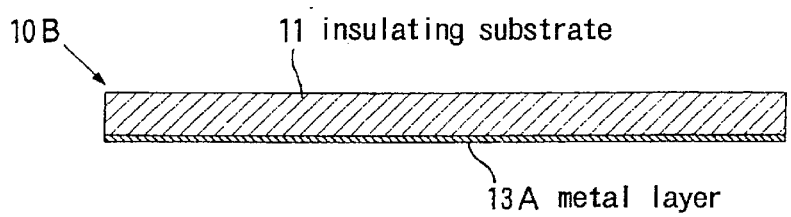
FIG. 5 is an explanatory sectional view, which shows a laminated material for obtaining the core wiring substrate member shown in FIG. 4.
Figure 6:
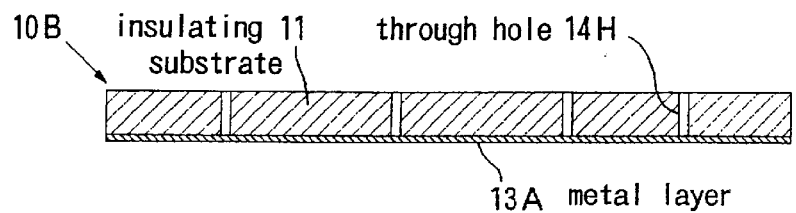
FIG. 6 is an explanatory sectional view, which shows the condition where through holes have been formed in the laminated material.

First, a laminated material, in which a copper layer of 18 μm thickness was formed on an insulating substrate comprised of a glass fiber reinforced epoxy resin of 500 μm thickness, was prepared, and through holes of 100 μm diameter were formed in the insulating substrate of the laminated material by a carbon dioxide gas laser device (see FIGS. 5 and 6).

Figure 7:
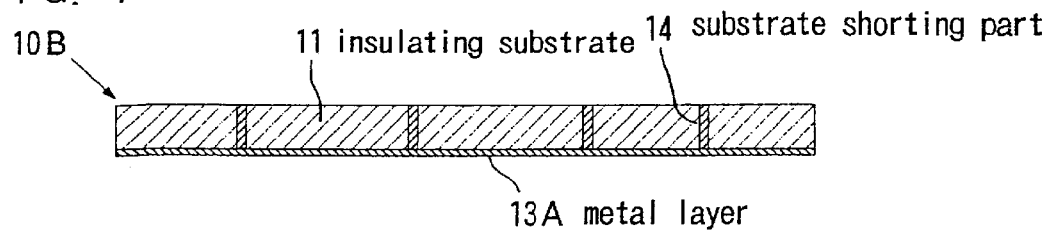
FIG. 7 is an explanatory sectional view, which shows the condition where substrate shorting parts have been formed in an insulating substrate.

The laminated material was then immersed, in one surface of the metal layer thereof being protected, in the dispersion of Example 6, and using the metal layer as the deposition cathode electrode, electrodeposition by the constant voltage method was performed in the conditions of an electrodeposition solution temperature of 20° C., a distance between electrodes of 25 cm, an application voltage of 200V, and a treatment time of 60 minutes to form a deposit of conductive microparticles and organic particles in the through holes of the insulating substrate. After then pre-drying at 100° C. for 15 minutes, heating was performed at 170° C. for 30 minutes in a reducing atmosphere (in nitrogen gas containing 3% hydrogen) to form substrate shorting parts (see FIG. 7).

Figure 4:
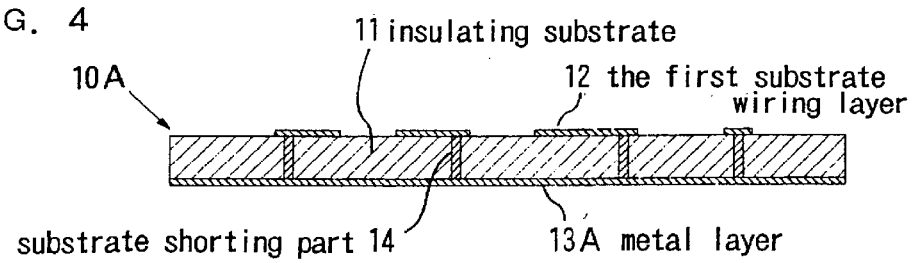
FIG. 4 is an explanatory sectional view, which shows a core wiring substrate member for obtaining the multilayer wiring board shown in FIG. 3.

After then polishing the surface of the insulating substrate of the laminated material, electroless copper plating and electrolytic copper plating were applied to the surface of the insulating substrate to form a metal layer of 20 μm thickness, and by performing photoetching on the metal layer, a first substrate wiring layer was formed, thereby manufacturing a core wiring substrate member, having a first substrate wiring layer and having a metal layer at the lower surface that is electrically connected via the substrate shorting parts to the first substrate wiring (see FIG. 4).

Figure 8:
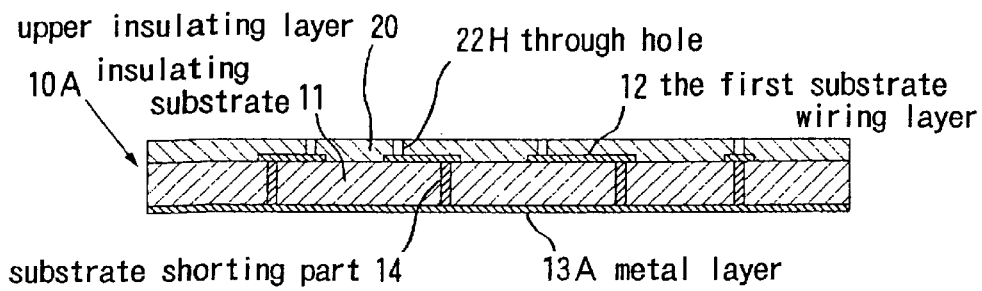
FIG. 8 is an explanatory sectional view, which shows the condition where an upper insulating layer has been formed on the upper surface of the core wiring substrate member.

(2) Formation of Upper Insulating Layer, Interlayer Shorting Parts, and Core Wiring Substrate An epoxy resin prepreg sheet of 60 μm thickness was heat pressed at a temperature of 165° C. and a pressure of 30 kg/cm² onto the upper surface of the core wiring substrate obtained in the above-described process of (1) to form an upper insulating layer, and through holes of 100 μm diameter were formed on the upper insulating layer by means of a carbon dioxide gas laser device (see FIG. 8).

Figure 9:
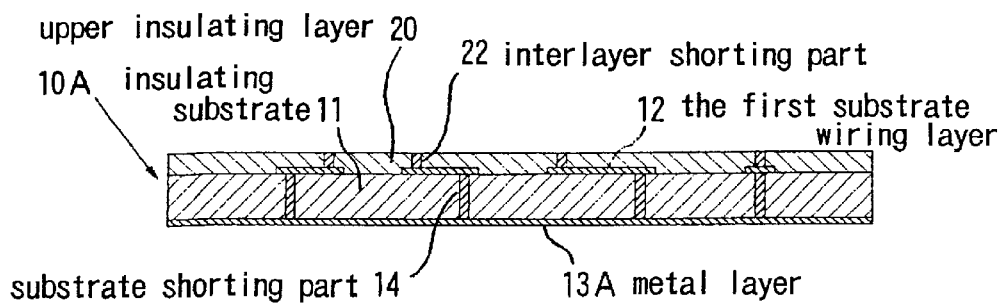
FIG. 9 is an explanatory sectional view, which shows the condition where interlayer shorting parts have been formed in the upper insulating layer.

Then in the lower surface of the metal layer of the core wiring substrate member being protected, electrodeposition by the constant voltage method was performed in the dispersion of Example 6, using the first substrate wiring layer as the deposition cathode, and in the conditions of an electrodeposited solution temperature of 20° C., a distance between electrodes of 25 cm, an application voltage of 200V, and a treatment time of 15 minutes to form a deposit of conductive microparticles and organic particles in the through holes of the upper insulating layer. After then pre-drying at 100° C. for 15 minutes, heating was performed at 170° C. for 30 minutes in a reducing atmosphere (in nitrogen gas containing 3% hydrogen) to form interlayer shorting parts (see FIG. 9).

Figure 10:
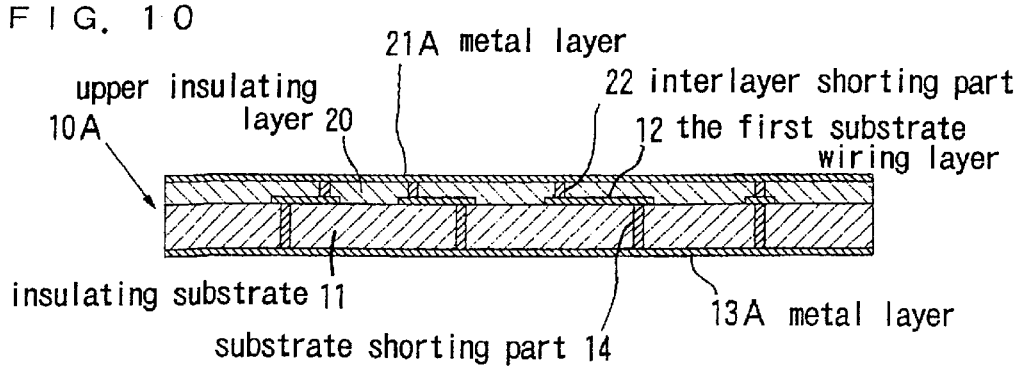
FIG. 10 is an explanatory sectional view, which shows the condition where a metal layer has been formed on the upper surface of the upper insulating layer.
Figure 11:
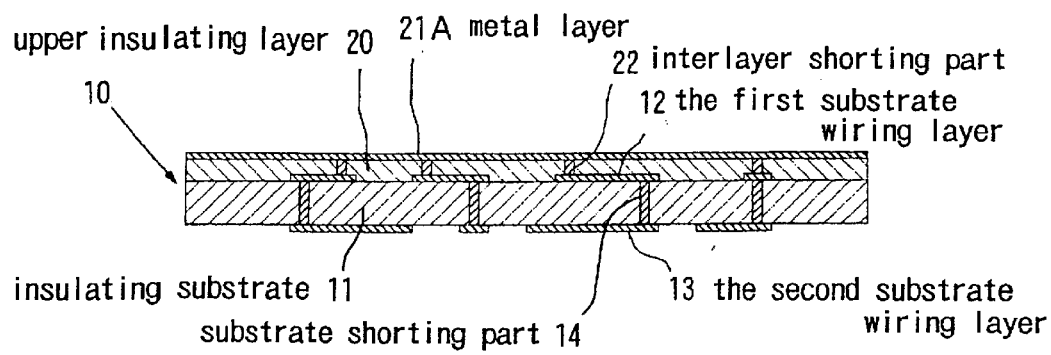
FIG. 11 is an explanatory sectional view, which shows the condition where a second substrate wiring layer has been formed on the lower surface of the insulating substrate, thereby forming a core wiring substrate.

After then polishing the surface of the upper insulating layer, electroless copper plating and electrolytic copper plating were applied to the surface of the upper insulating layer to form a metal layer of 20 μm thickness (see FIG. 10), and by performing photoetching on the metal layer on the core wiring substrate member, a second substrate wiring layer was formed, thereby manufacturing a core wiring substrate (see FIG. 11).

Figure 12:
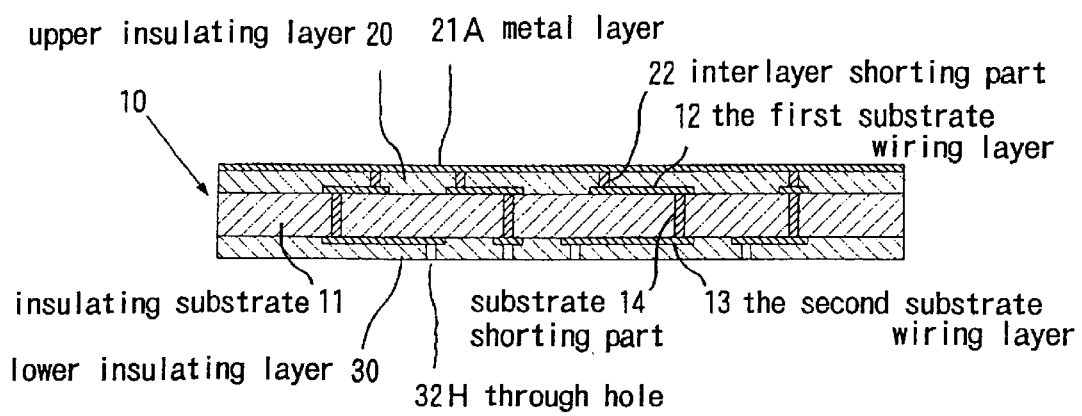
FIG. 12 is an explanatory sectional view, which shows the condition where a lower insulating layer has been formed on the lower surface of the core wiring substrate.

(3) Formation of Lower Insulating Layer, Interlayer Shorting Parts, Upper Wiring Layer, and Lower Wiring Layer An epoxy resin prepreg sheet of 60 μm thickness was heat pressed at a temperature of 165° C. and a pressure of 30 kg/cm² onto the lower surface of the core wiring substrate, obtained in the above-described process of (2) and having an upper insulating layer and interlayer shorting parts formed on the upper surface, thereby forming a lower insulating layer, and through holes of 100 μm diameter were formed on the lower insulating layer by means of a carbon dioxide gas laser device (see FIG. 12).

Figure 13:
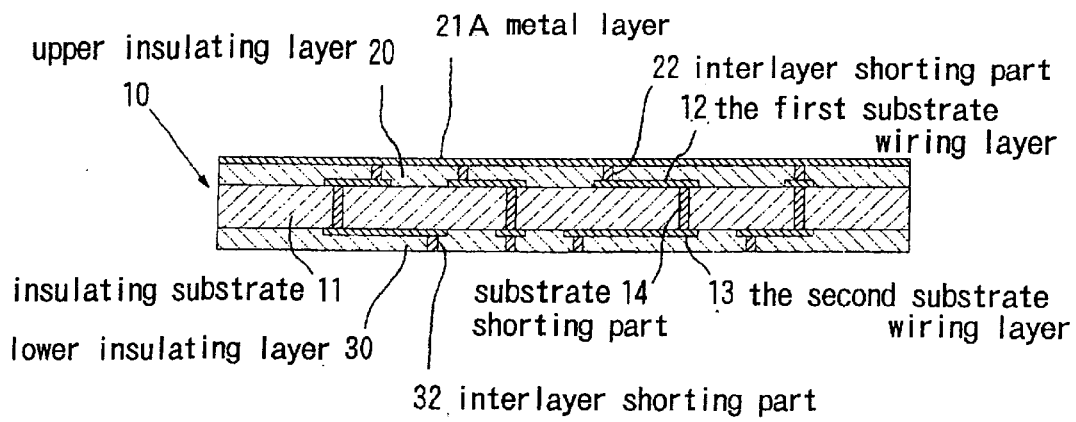
FIG. 13 is an explanatory sectional view, which shows the condition where interlayer shorting parts have been formed on the lower insulating layer.

Then in the upper surface of the metal layer formed on the upper insulating layer being protected, electrodeposition by the constant voltage method was performed in the dispersion of Example 6, using the second substrate wiring layer as the deposition cathode, and in the conditions of an electrodeposition solution temperature of 20° C., a distance between electrodes of 25 cm, an application voltage of 200V, and a treatment time of 8 minutes, thereby forming a deposit of conductive microparticles and organic particles in the through holes of the upper insulating layer. After then pre-drying at 100° C. for 15 minutes, heating was performed at 170° C. for 30 minutes in a reducing atmosphere (in nitrogen gas containing 3% hydrogen), thereby forming interlayer shorting parts (see FIG. 13).

After then polishing the surface of the lower insulating layer, electroless copper plating and electrolytic copper plating were applied to the surface of the lower insulating layer, thereby forming a metal layer of 20 μm thickness. By then performing photoetching on the metal layer formed on each of the surfaces of the upper insulating layer and lower insulating layer, an upper wiring layer and a lower wiring layer were formed (see FIG. 14).

By then forming solder resist layers on the surface of the upper insulating layer, including the upper wiring layer, and the surface of the lower insulating layer, including the lower wiring layer, a multilayer wiring board of the invention was manufactured.

In the above, the proportion as volume percentage of the conductive microparticles in the substrate shorting parts and the interlayer shorting parts, formed on each of the upper insulating layer and the lower insulating layer, was approximately 53%.

EXAMPLE 14

The dispersion of Example 7 was used in place of the dispersion of Example 6 in the forming of the substrate shorting parts and the interlayer shorting parts, and after pre-drying of the deposit formed by electrodeposition, immersion in a copper electroplating solution (trade name: "Microfab Cu 200"; made by Nihon Electroplating Inc.) and electrodeposition using conductive foil 42 as the cathode was performed for 5 minutes at a voltage of 1V and a conduction time during 1 cycle of 100 ms (0V for 300 ms). Otherwise, a multilayer wiring board of the invention was manufactured in the same manner as in Example 13.

In the above, the proportion as volume percentage of the conductive microparticles in the substrate shorting parts and the interlayer shorting parts, formed on each of the upper insulating layer and the lower insulating layer, was approximately 85%.

COMPARATIVE EXAMPLE 5

Instead of forming the substrate shorting parts and the interlayer shorting parts by use of an electrodeposition solution, the substrate shorting parts and interlayer shorting parts were formed by filling the through holes in a copper-based conductive paste (viscosity: 100 Pa·s) via a metal plate (thickness: 100 μm; hole diameter: 90 μm) and by means of a screen printer and then performing heat treatment at 170° C. for 30 minutes in a reducing atmosphere (in nitrogen gas containing 3% hydrogen). Otherwise, a multilayer wiring board for comparison was manufactured in the same manner as in Example 12.

Evaluation of the Multilayer Wiring Boards (1) Initial Electrical Resistance of the Wiring The values of the electrical resistance across the connection lands of the upper wiring layer and the connection lands of the lower wiring layer of a multilayer wiring board were measured and the average value thereof was determined.

(2) Electrical Resistance of the Wiring After Heat Cycle Test

The cycle of leaving a multilayer wiring board for 30 minutes at −55° C. and then for 30 minutes at 125° C. was repeated 500 times in total, and thereafter, the values of the electrical resistance across the connection lands of the upper wiring layer and the connection lands of the lower wiring layer of the multilayer wiring board were measured and the average value per connection land was determined.

The results of the above are shown in Table 6.

TABLE 6

|  | Electrical resistance (mΩ) | |
| --- | --- | --- |
|  | Initial | After heat cycle test |
| Example 13 | 0.2 | 0.3 |
| Example 14 | 0.1 | 0.1 |
| Comparative Example 5 | 0.4 | 1.0 |

As is clear from the results of Table 6, the multilayer wiring boards of Example 13 and Example 14, were low in the electrical resistance of the wiring, small in the change of electrical resistance of the wiring after the heat cycle test, and where thus confirmed to be of high connection reliability.

The invention is not limited to the embodiments described above and various modifications may be made. For example, the insulating layer to be formed on the core wiring substrate may be made on either one surface or the other surface of the core wiring substrate and another insulating layer may be laminated on top of the insulating layer. Also, the core wiring substrate may have a multilayer arrangement as long as substrate wiring layers that are mutually connected electrically are formed on both surfaces.

What is claimed is:

1. An aqueous dispersion forming conductive layer characterized in that conductive microparticles, with a number-average particle diameter of 1 μm or less, and organic particles, which are comprised of at least one of either a polymerizable compound or a polymer, are dispersed in an aqueous medium and in enabling the formation of a conductive layer by electrodeposition.

2. An aqueous dispersion forming conductive layer as set forth in claim 1, wherein the volume ratio of said conductive microparticles to said organic particles is 99:1 to 40:60.

3. An aqueous dispersion forming conductive layer as set forth in claim 1, which is prepared by mixing a conductive microparticle dispersive solution, in which said conductive microparticles are dispersed in an organic solvent, and an organic particle dispersive solution, in which said organic particles are dispersed in an aqueous medium.

4. An conductive layer characterized in being formed by electrodeposition using a aqueous dispersion forming conductive layer as set forth in claim 1 and in that the volume resistivity is $10^{-4}$ Ω·cm or less.

5. An electronic part characterized in being equipped in a conductive layer formed by electrodeposition using an aqueous dispersion forming conductive layer as set forth in claim 1.

6. A circuit board characterized in having an insulating layer and a conductive layer, which is formed by an electrodeposition method using an aqueous dispersion forming conductive layer as set forth in claim 1 as an electrodeposition solution and includes conducting through parts that pass through said insulating layer.

7. A circuit board manufacturing method characterized in using an aqueous dispersion forming conductive layer as set forth in claim 1 and being comprised of;

(a) a process of forming through holes in an insulating layer, (b) a process of setting a conductive foil on a part of one surface of said insulating layer that includes the openings at one end of said through holes, and (c) a process of forming conducting through parts inside said through holes by an electrodeposition method using said aqueous dispersion forming conductive layer as the electrodeposition solution and using said conductive foil as one of the electrodes.

8. A circuit board manufacturing method characterized in using an aqueous dispersion forming conductive layer as set forth in claim 1 and being comprised of;

(a) a process of forming an insulating layer on a core wiring substrate on which a conducting pattern has been formed, (b) a process of patterning said insulating layer and forming an insulating layer pattern in through holes that expose a part of said conducting pattern, (c) a process of forming an electroless plated layer at parts including the interiors of said through holes by electroless deposition using said insulating layer pattern as a mask material, and (d) a process of forming a conductive layer, which includes conducting through parts at interiors of said through holes, by electrodeposition using said aqueous dispersion forming conductive layer as an electrodeposition solution and using said conducting pattern and said electrolessplated layer as one of electrodes.

9. A circuit board manufacturing method characterized in that a plurality of circuit boards, obtained by a method set forth in claim 7, are laminated.

10. A circuit board manufacturing method characterized in that a plurality of circuit boards, obtained by a method set forth in claim 8, are laminated.

11. A multilayer wiring board characterized in having a core wiring substrate, which is arranged by forming substrate wiring layers that are mutually connected electrically on both surfaces of an insulating substrate, an insulating layer, which is laminated onto at least one surface of the core wiring substrate, a wiring layer, which is formed on said insulating layer, and interlayer shorting parts, which extend through said insulating layer in the thickness direction and electrically connect said wiring layer to said substrate wiring layer, said multilayer wiring board being characterized in that each of said interlayer shorting parts is comprised of a conductor, in which conductive microparticles are contained inside a polymer substance, and in that said conductor is formed by electrodeposition in an electrodeposition solution, in which conductive microparticles and organic particles, comprised of at least one of either a polymerizable compound or a polymer, are dispersed in an aqueous medium.

12. A multilayer wiring board as set forth in claim 11, wherein said core wiring substrate has substrate shorting parts, which electrically connect said substrate wiring layers, formed on both sides of said insulating substrate, to each other and extend through said insulating substrate in the thickness direction, each of said substrate shorting parts is comprised of a conductor, in which conductive microparticles are contained inside a polymer substance, and said conductor is formed by electrodeposition in an electrodeposition solution, in which conductive microparticles and organic particles, comprised of at least one of either a polymerizable compound or a polymer, are dispersed in an aqueous medium.

13. A multilayer wiring board as set forth in claim 11, wherein the proportion as volume percentage of said conductive microparticles in said conductors that comprise said interlayer shorting parts and/or substrate shorting parts is 40 to 99%.

14. A method of manufacturing a multilayer wiring board as set forth in claim 11, characterized in being comprised of;

a process of preparing a core wiring substrate member, which is comprised of an insulating substrate, a substrate wiring layer, formed on one surface of said insulating substrate, and a metal layer, formed on the other surface of said insulating substrate and electrically connected to said substrate wiring layer, a process of forming an insulating layer, having through holes formed in correspondence to interlayer shorting parts to be formed on the substrate wiring layer, on one surface of said core wiring substrate member, and a process of forming conductors that comprise said interlayer shorting parts inside said through holes of said insulating layer by electrodeposition using an electrodeposition solution, in which conductive microparticles and organic particles comprised of at least one of either a polymerizable compound or a polymer, are dispersed in an aqueous medium, with said substrate wiring layer of the core wire substrate member on which said insulating layer was formed, as a deposition electrode.

15. A multilayer wiring board manufacturing method as set forth in claim 14, wherein a substrate forming material, having an insulating substrate and a metal layer, formed on at least one surface of said insulating substrate, is prepared, through holes, which pass through said insulating substrate of said substrate forming material in the thickness direction thereof, are formed, and after performing electrodeposition, using said metal layer of said substrate forming material as the deposition electrode, in an electrodeposition solution, in which conductive microparticles and organic particles comprised of at least one of either a polymerizable compound or a polymer, are dispersed in an aqueous medium, to form conductors that comprise substrate shorting parts inside said through holes of said insulating substrate, a substrate wiring part is formed on one surface of said insulating substrate to form said core wiring substrate member.

16. A multilayer wiring board manufacturing method as set forth in claim 14, wherein the volume ratio of said conductive microparticles to said organic particles is 99:1 to 40:60.

* * * * *

UNITED STATES PATENT AND TRADEMARK OFFICE
CERTIFICATE OF CORRECTION

PATENT NO. : 6,625,032 B1
DATED : September 23, 2003
INVENTOR(S) : Ito et al.

It is certified that error appears in the above-identified patent and that said Letters Patent is hereby corrected as shown below:

<u>Title page, Item [54], and Column 1, lines 1-8,</u>
Title, should read, -- [54] AQUEOUS DISPERSION FORMING CONDUCTIVE LAYER, CONDUCTIVE LAYER, ELECTRONIC COMPONENT, CIRCUIT BOARD AND METHOD FOR MANUFACTURING THE SAME, AND MULTILAYER WIRING BOARD AND METHOD FOR MANUFACTURING THE SAME --

<u>Title page,</u>
After Item [22], please insert Item [30] to read as follows:
-- [30]    Foreign Application Priority Data
     Nov. 1, 1999  (JP) ........................... 11-311538
     May. 1, 2000  (JP) ........................... 2000-132832
     Jul. 10, 2000  (JP) .......................... 2000-207646 --

Signed and Sealed this

Twenty-fourth Day of February, 2004

JON W. DUDAS
*Acting Director of the United States Patent and Trademark Office*